(12) United States Patent
Onda

(10) Patent No.: US 8,058,162 B2
(45) Date of Patent: Nov. 15, 2011

(54) NONVOLATILE SEMICONDUCTOR MEMORY AND METHOD OF MANUFACTURING THE SAME

(75) Inventor: Takayuki Onda, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/755,462

(22) Filed: Apr. 7, 2010

(65) Prior Publication Data

US 2010/0255670 A1    Oct. 7, 2010

(30) Foreign Application Priority Data

Apr. 7, 2009   (JP) ................................ 2009-093240

(51) Int. Cl.
  *H01L 21/3205*    (2006.01)
(52) U.S. Cl. ................. 438/591; 438/287; 257/E21.679
(58) Field of Classification Search .................. 438/591, 438/287; 257/E21.679
  See application file for complete search history.

(56) References Cited

U.S. PATENT DOCUMENTS

| 6,194,300 B1 * | 2/2001 | Hung et al. ................. 438/593 |
| 2007/0155153 A1 * | 7/2007 | Okazaki et al. ............. 438/597 |

FOREIGN PATENT DOCUMENTS

| JP | 2005-228957 | 8/2005 |
| JP | 2006-253433 | 9/2006 |

* cited by examiner

*Primary Examiner* — Angel Roman
*Assistant Examiner* — Stanetta Isaac
(74) *Attorney, Agent, or Firm* — Young & Thompson

(57) ABSTRACT

A method of manufacturing a nonvolatile semiconductor memory includes: forming an insulator structure on a semiconductor substrate in a first region; forming a first gate insulating film on the semiconductor substrate outside the first region; blanket depositing a first gate material film and etching-back the first gate material film to form a first gate electrode on the first gate insulating film lateral to the insulator structure; removing the insulator structure; blanket forming a second gate insulating film; blanket depositing a second gate material film and etching-back the second gate material film to form a second gate electrode on the second gate insulating film in the first region; and silicidation of upper surfaces of the first and second gate electrodes. Any one of the first and second gate insulating films is a charge trapping film.

11 Claims, 32 Drawing Sheets

NONVOLATILE SEMICONDUCTOR MEMORY AND METHOD OF MANUFACTURING THE SAME

INCORPORATION BY REFERENCE

This application is based upon and claims the benefit of priority from Japanese patent application No. 2009-093240, filed on Apr. 7, 2009, the disclosure of which is incorporated herein in its entirety by reference.

BACKGROUND OF THE INVENTION

1. Field of the Invention

The present invention relates to a nonvolatile semiconductor memory. In particular, the present invention relates to a charge trapping memory of a split gate type and a manufacturing method thereof.

2. Description of Related Art

A flash memory and a charge trapping memory are known as a electrically erasable and programmable nonvolatile semiconductor memory. The charge trapping memory stores data by using an element that is capable of trapping charges. The element for trapping charges is a MONOS (Metal Oxide Nitride Oxide Silicon) transistor, for example. The MONOS transistor is a type of MIS (Metal Insulator Silicon) transistor, where an ONO (Oxide Nitride Oxide) film obtained by laminating a silicon oxide film, a silicon nitride film and a silicon oxide film in this order is used as a gate insulating film thereof.

The silicon nitride film in the ONO film has property trapping charges. For example, it is possible to inject electrons into the silicon nitride film by applying appropriate potentials to a gate electrode, source/drain and a substrate. In a case where electrons are trapped by the silicon nitride film, a threshold voltage of the MONOS transistor is increased as compared with a case where electrons are not trapped. On the contrary, when the trapped electrons are drawn out from the silicon nitride film, the threshold voltage is decreased. By utilizing such change in the threshold voltage, the MONOS transistor can nonvolatilely store data "1" and "0". That is, the charge trapping memory stores data by utilizing the MONOS transistor as a memory cell transistor.

Japanese Patent Publication JP-2005-228957A and Japanese Patent Publication JP-2006-253433A disclose a charge trapping memory of a split gate type where one memory cell has two gate electrodes. More specifically, one memory cell is provided with a first gate electrode and a second gate electrode that are arranged side by side on a channel region. An ONO film is formed between the first gate electrode and the channel region, and an ordinary gate insulating film is formed between the second gate electrode and the channel region. According to this related technique, the two gate electrodes both are formed by etching-back technique.

SUMMARY

The inventor of the present application has recognized the following point. In order to improve a data read speed in the charge trapping memory, it is necessary to rapidly raise the gate electrode potential up to a predetermined read potential. In particular, in the case of the split gate type, it is necessary to rapidly raise respective potentials of the two gate electrodes up to predetermined read potentials. Regarding the charge trapping memory of the split gate type, a technique that can improve the data read speed is desired.

In one exemplary embodiment of the present invention, a nonvolatile semiconductor memory is provided. The nonvolatile semiconductor memory has; a semiconductor substrate in which a first diffusion layer and a second diffusion layer are formed; a first gate electrode having a sidewall shape and formed on a channel region between the first diffusion layer and the second diffusion layer through a first gate insulating film; a second gate electrode having a sidewall shape and formed on the channel region through a second gate insulating film; a first silicide film formed on an upper surface of the first gate electrode; and a second silicide film formed on an upper surface of the second gate electrode. The first gate electrode and the second gate electrode are arranged side by side on the channel region, and an insulating film is interposed between the first gate electrode and the second gate electrode. Any one of the first gate insulating film and the second gate insulating film is a charge trapping film that traps charges.

In another exemplary embodiment of the present invention, a method of manufacturing a nonvolatile semiconductor memory is provided. The method includes: (A) forming an insulator structure on a semiconductor substrate in a first region; (B) forming a first gate insulating film on the semiconductor substrate outside the first region; (C) blanket depositing a first gate material film and etching-back the first gate material film to form a first gate electrode on the first gate insulating film lateral to the insulator structure; (D) removing the insulator structure; (E) blanket forming a second gate insulating film; (F) blanket depositing a second gate material film and etching-back the second gate material film to form a second gate electrode on the second gate insulating film in the first region; and (G) silicidation of upper surfaces of the first gate electrode and the second gate electrode. Any one of the first gate insulating film and the second gate insulating film is a charge trapping film that traps charges.

In still another exemplary embodiment of the present invention, a method of manufacturing a nonvolatile semiconductor memory is provided. The method includes: (a) forming an insulator structure on a semiconductor substrate, wherein the insulator structure has a trench that reaches the semiconductor substrate; (b) forming a first gate insulating film on the semiconductor substrate in the trench; (c) blanket depositing a first gate material film and etching-back the first gate material film to form a first gate electrode on the first gate insulating film within the trench; (d) silicidation of an upper surface of the first gate electrode; (e) forming a trench structure that includes the first gate insulating film and the first gate electrode and fills the trench; (f) removing the insulator structure; (g) blanket forming a second gate insulating film; (h) blanket depositing a second gate material film and etching-back the second gate material film to form a second gate electrode on the second gate insulating film lateral to the trench structure; and (i) silicidation of an upper surface of the second gate electrode. Any one of the first gate insulating film and the second gate insulating film is a charge trapping film that traps charges.

According to the present invention, it is possible to reduce an area and improve a data read speed with regard to the charge trapping memory of the split gate type.

BRIEF DESCRIPTION OF THE DRAWINGS

The above and other objects, advantages and features of the present invention will be more apparent from the following description of certain preferred exemplary embodiments taken in conjunction with the accompanying drawings, in which.

DESCRIPTION OF PREFERRED EMBODIMENTS

The invention will be now described herein with reference to illustrative exemplary embodiments. Those skilled in the art will recognize that many alternative exemplary embodiments can be accomplished using the teachings of the present invention and that the invention is not limited to the exemplary embodiments illustrated for explanatory purposed.

A nonvolatile semiconductor memory and a manufacturing method thereof according to exemplary embodiments of the present invention will be described referring to the attached drawings. The nonvolatile semiconductor memory according to the present exemplary embodiment is a charge trapping memory of a split gate type.

1. First Exemplary Embodiment

1-1. Structure

Figure 1:
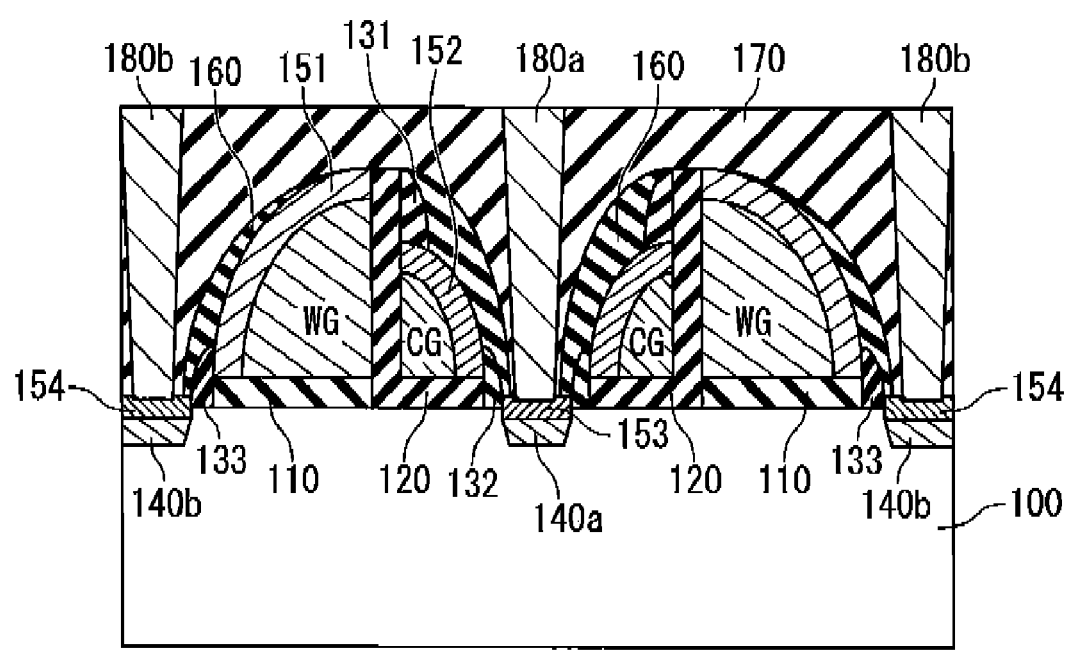
FIG. 1 is a sectional view showing a structure of a nonvolatile semiconductor memory according to a first exemplary embodiment of the present invention.

FIG. 1 is a sectional view showing a structural example of a nonvolatile semiconductor memory according to a first exemplary embodiment of the present invention. In a semiconductor substrate 100, a diffusion layer 140a and a diffusion layer 140b serving as source/drain are formed. For example, the semiconductor substrate 100 is a p-type silicon substrate (P-type well), and the diffusion layer 140a and the diffusion layer 140b are N-type diffusion layers. A semiconductor region between the diffusion layer 140a and the diffusion layer 140b is a channel region.

A word gate WG is formed on a part of the channel region through a first gate insulating film 110. A control gate CG is formed on another part of the channel region through a second gate insulating film 120. That is, the word gate WG and the control gate CG are arranged side by side on the channel region, and they face each other across an insulating film. In the example shown in FIG. 1, the insulating film interposed between the word gate WG and the control gate CG is a part of the second gate insulating film 120. That is the second gate insulating film 120 extends from between the control gate CG and the semiconductor substrate 100 to between the control gate CG and the word gate WG.

Both the word gate WG and the control gate CG have sidewall shapes (sidewall structures). This results from a fact that the word gate WG and the control gate CG are formed by etching-back technique, as will be described later. In the example shown in FIG. 1, an upper surface of the word gate WG is curved and comes down (comes closer to the semiconductor substrate 100) as away from the control gate CG. Similarly, an upper surface of the control gate CG also is curved and comes down as away from the word gate WG. That is, the respective curved surfaces of the word gate WG and the control gate CG having the sidewall shapes are oriented in opposite directions to each other. Moreover, in the example shown in FIG. 1, the uppermost portion of the control gate CG is located below the uppermost portion of the word gate WG.

In the present exemplary embodiment, respective upper surfaces of the word gate WG, the control gate CG, the diffusion layer 140a and the diffusion layer 140b are silicided. Specifically, a silicide film 151 is formed on the upper surface of the word gate WG, and a silicide film 152 is formed on the upper surface of the control gate CG. For example, the word gate WG and the control gate CG are made of polysilicon, and the silicide films 151 and 152 are cobalt silicide (CoSi) films. Further, a silicide film 153 is formed on the diffusion layer 140a and a silicide film 154 is formed on the diffusion layer 140b. For example, the silicide films 153 and 154 are cobalt silicide films.

Moreover, an insulator 131 is formed between the silicide film 151 on the word gate WG and the silicide film 152 on the control gate CG. It should be noted that the insulator 131 is a different component from the second gate insulating film 120 interposed between the word gate WG and the control gate CG. That is, the insulator 131 is separately formed by a process different from a process for forming the second gate insulating film 120. In the example shown in FIG. 1, the insulator 131 has a sidewall shape (sidewall structure), and it is hereinafter referred to as a "sidewall insulator 131". The sidewall insulator 131 is formed on the control gate CG (silicide film 152) whose height is lower than the word gate WG. That is, a stacked structure of the control gate CG and the sidewall insulator 131 face the word gate WG across the second gate insulating film 120. As described later, the sidewall insulator 131 formed between the silicide film 151 and the silicide film 152 is effective for preventing short-circuit between the silicide film 151 and the silicide film 152.

Moreover, an insulator 132 is formed between the silicide film 152 on the control gate CG and the silicide film 153 on the diffusion layer 140a. Furthermore, an insulator 133 is formed between the silicide film 151 on the word gate WG and the silicide film 154 on the diffusion layer 140b. Each of the insulator 132 and the insulator 133 also has a sidewall shape (sidewall structure) similarly to the above-mentioned sidewall insulator 131 and is hereinafter referred to as a "sidewall insulator". In the example shown in FIG. 1, the sidewall insulators 132 and 133 are so formed as to be in contact with the semiconductor substrate 100. As described later, the sidewall insulator 132 is effective for preventing short-circuit between the silicide film 152 and the silicide film 153, and the sidewall insulator 133 is effective for preventing short-circuit between the silicide film 151 and the silicide film 154.

A protective insulating film 160 is so formed as to cover the silicide film 151 and the silicide film 152. Further, an interlayer insulating film 170 is so formed as to cover the whole. A contact 160a is formed to penetrate through the interlayer insulating film 170 to electrically connect to the silicide film 153 on the diffusion layer 140a. A contact 180b is formed to penetrate through the interlayer insulating film 170 to electrically connect to the silicide film 154 on the diffusion layer 140b. The contact 180a and the contact 180b are connected to bit lines.

In the present exemplary embodiment, the second gate insulating film 120 on the side of the control gate CG is a charge trapping film which traps charges. For example, the second gate insulating film 120 is an ONO film formed by laminating a silicon oxide film, a silicon nitride film and a silicon oxide film in this order. In this case, the control gate CG serves as a gate electrode of a MONOS transistor. In a case where charges are trapped in the ONO film, a threshold voltage of the MONOS transistor is increased as compared with a case where charges are not trapped in the ONO film. By utilizing such change in the threshold voltage, the memory cell according to the present exemplary embodiment can non-volatilely store data "1" and "0". In FIG. 1, memory cells corresponding to two bits are shown.

Electron injection into the ONO film is achieved by a CHE (Channel Hot Electron) method. When appropriate potentials are respectively applied to the semiconductor substrate 100, the word gate WG, the control gate CG, the diffusion layer 140a and the diffusion layer 140b, electrons move from the diffusion layer 140b (the source) toward the diffusion layer 140a (the drain). Electrons in the channel region are accelerated by intense electric field between the word gate WG and the control gate CG and intense electric field near the drain to be channel hot electrons. Some of the generated channel hot electrons are injected into the ONO film below the control gate CG. As a result, the threshold voltage of the MONOS transistor is increased.

In order to lower the threshold voltage, electrons are drawn out from the ONO film or holes are injected into the ONO film. In the present exemplary embodiment, for example, holes are injected into the ONO film (HHI: Not Hole Injection method). In this case, a negative potential is applied to the control gate CG and a positive potential is applied to the diffusion layer 140a, so that intense electric field is generated between the control gate CG and the diffusion layer 140a. When the intense electric field is applied to a depletion layer around an edge portion of the diffusion layer 140a, "band-to-band tunnel phenomenon" occurs in the depletion layer. Due to the band-to-band tunnel phenomenon, electron-hole pairs are generated in the depletion layer where no carriers originally exist. Electrons of the electron-hole pairs are attracted toward the diffusion layer 140a. On the other hand, holes of the electron-hole pairs are attracted toward the channel region by a depletion layer electric field. At this time, the holes are accelerated by the depletion layer electric field to be hot holes. The hot holes having high energy are attracted to the negative potential of the control gate CG to be injected into the ONO film below the control gate CG. As a result, the threshold voltage of the MONOS transistor is decreased.

At the time of data reading from the memory cell, appropriate read potentials are respectively applied to the semiconductor substrate 100, the word gate WG, the control gate CG, the diffusion layer 140a and the diffusion layer 140b. In a case where the threshold voltage is high, the MONOS transistor remains at the OFF state and the channel is non-conductive. On the other hand, in a case where the threshold voltage is low, the MONOS transistor is turned ON, and electrons move from the diffusion layer 140a (the source) toward the diffusion layer 140b (the drain). Therefore, the data stored in the memory cell can be determined based upon magnitude of a read current flowing through a bit line connecting to the source or the drain.

In order to improve the data read speed, it is necessary to rapidly raise the potentials of the control gate CG and the word gate WG to predetermined read potentials. However, since the control gate CG and the word gate WG are typically made of polysilicon, their resistance values are high. According to the present exemplary embodiment, the upper surfaces of the control gate CG and the word gate WG are silicided. It is therefore possible to rapidly raise the potentials of the control gate CG and the word gate WD up to the predetermined read potentials. That is, the data read speed is improved.

1-2. Manufacturing Method

Next, a manufacturing method of the nonvolatile semiconductor memory according to the present exemplary embodiment will be described. FIGS. 2 to 12 are sectional views showing an example of manufacturing processes of the structure shown in FIG. 1.

Figure 2:
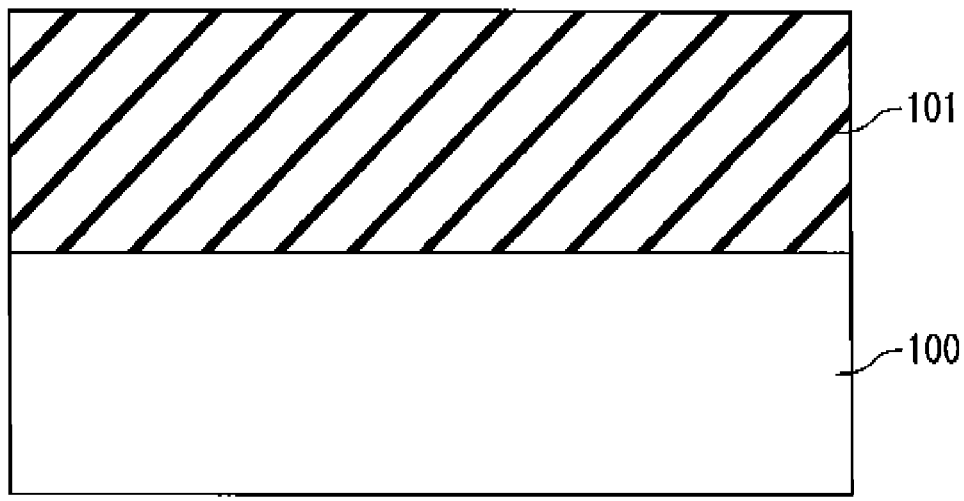
FIG. 2 is a sectional view showing a manufacturing process of the nonvolatile semiconductor memory according to the first exemplary embodiment.

As shown in FIG. 2, first, an insulating film 101 is formed on a semiconductor substrate 100. For example, the semiconductor substrate 100 is a P-type silicon substrate (P-type well), and the insulating film 101 is a $SiO_2$ film.

Figure 3:
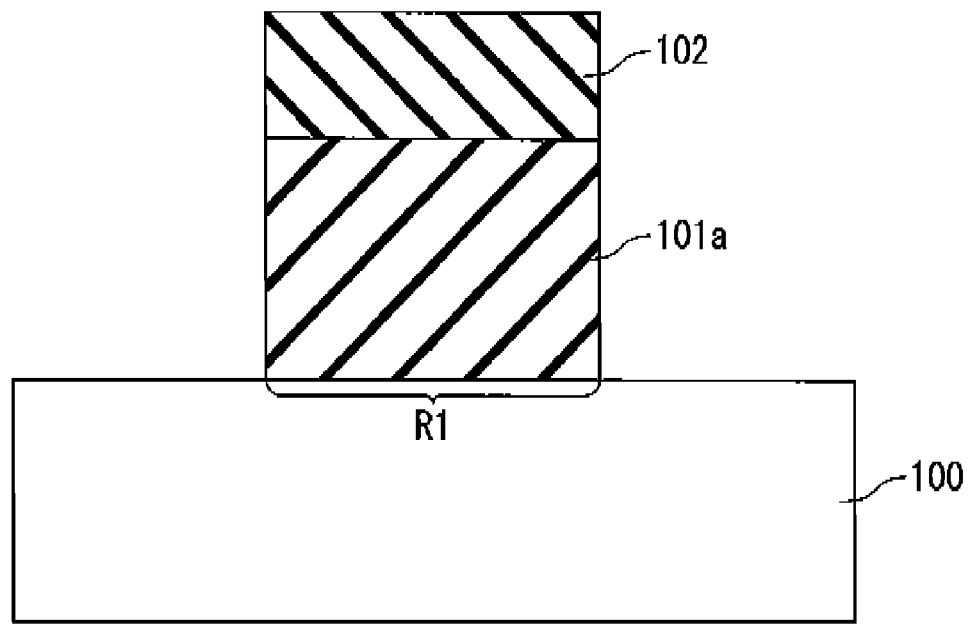
FIG. 3 is a sectional view showing the manufacturing process of the nonvolatile semiconductor memory according to the first exemplary embodiment.

Next, as shown in FIG. 3, a photoresist 102 having a predetermined pattern is formed on the insulating film 101, and the insulating film 101 is etched using the photoresist 102. As a result, an insulator structure 101a composed of the insulating film 101 is formed on the semiconductor substrate 100 in a region R1. Thereafter, the photoresist 102 is removed.

Figure 4:
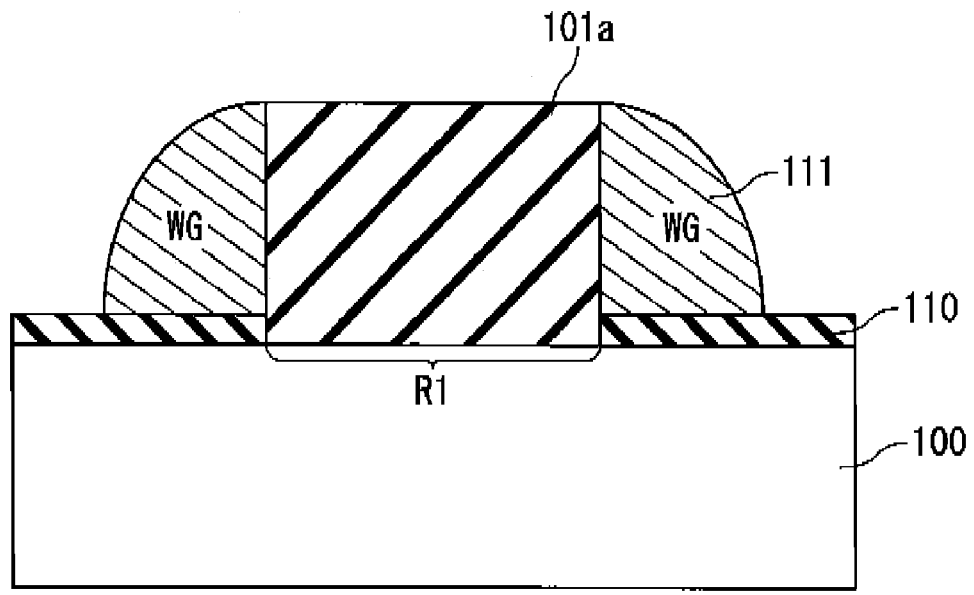
FIG. 4 is a sectional view showing the manufacturing process of the nonvolatile semiconductor memory according to the first exemplary embodiment.

Next, as shown in FIG. 4, a first gate insulating film 110 is formed on the semiconductor substrate 100 outside the region R1. The first gate insulating film 110 is a $SiO_2$ film formed by thermal oxidation method, for example. Subsequently, a first polysilicon film (first gate material film) 111 is blanket deposited by a CVD method. The first polysilicon film 111 is a material film for the word gate WG. Subsequently, etching-back of the first polysilicon film 111 is performed. As a result, the word gate WG having a sidewall shape is formed on the first insulating film 110 lateral to the insulator structure 101a.

Figure 5:
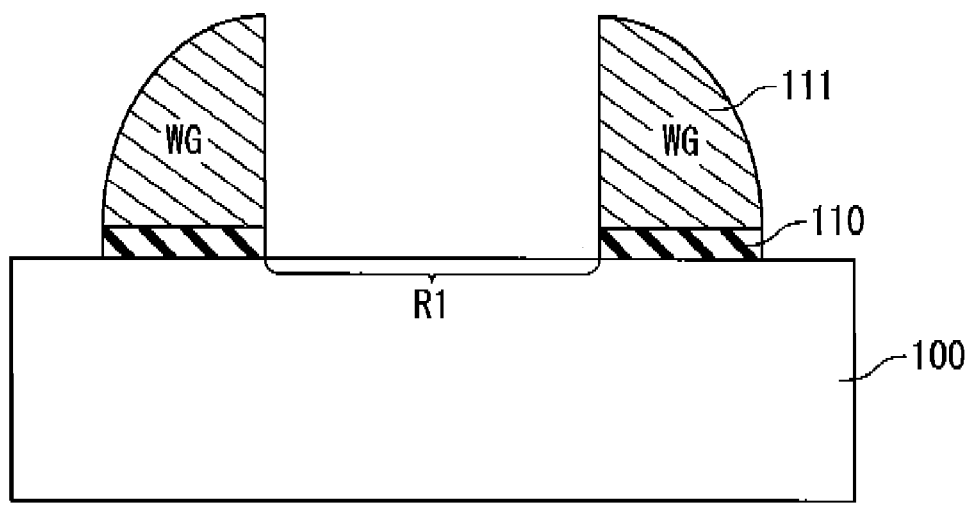
FIG. 5 is a sectional view showing the manufacturing process of the nonvolatile semiconductor memory according to the first exemplary embodiment.

Next, as shown in FIG. 5, the insulator structure 101a in the region R1 is removed by etching.

Figure 6:
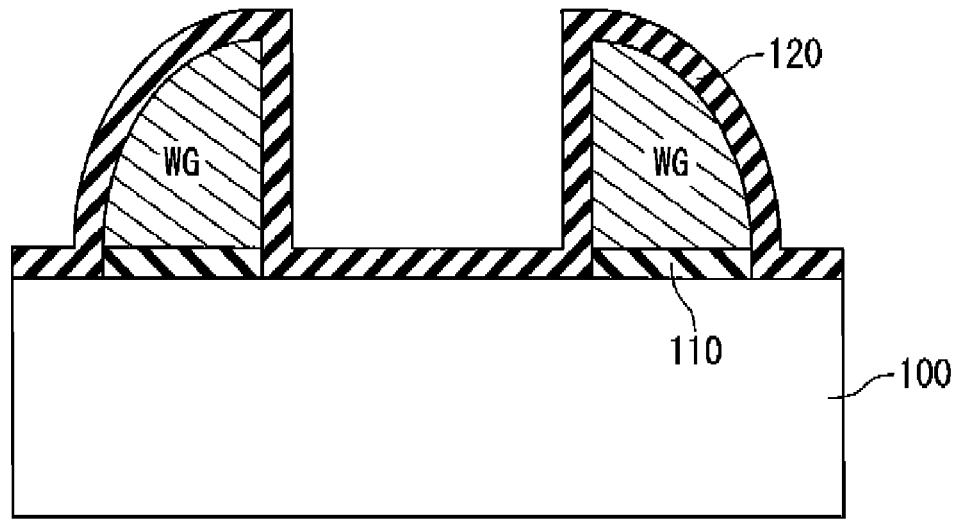
FIG. 6 is a sectional view showing the manufacturing process of the nonvolatile semiconductor memory according to the first exemplary embodiment.

Next, as shown in FIG. 6, a second gate insulating film 120 serving as a charge trapping film is blanket formed. For example, the second gate insulating film 120 is an ONO film, and it is formed by laminating a silicon oxide film, a silicon nitride film and a silicon oxide film in this order by the CVD method.

Figure 7:
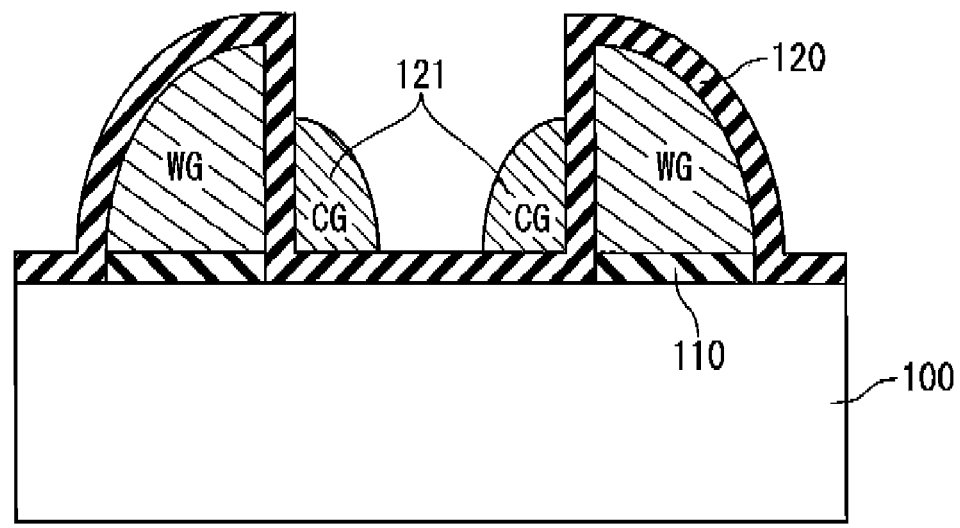
FIG. 7 is a sectional view showing the manufacturing process of the nonvolatile semiconductor memory according to the first exemplary embodiment.

Next, a second polysilicon film (second gate material film) 121 is blanket deposited by the CVD method. The second polysilicon film 121 is a material film for the control gate CG. Subsequently, etching-back of the second polysilicon film 121 is performed. As a result, as shown in FIG. 7, the control gate CG having a sidewall shape is formed on the second gate insulating film 120 within the above-mentioned region R1. As shown in FIG. 7, the control gate CG is formed such that its uppermost portion is located below the uppermost portion of the word gate WG.

Thus, the word gate WG and the control gate CG facing each other across the second gate insulating film 120 are formed in a self-aligned manner by the etching-back technique. Both the word gate WG and the control gate CG have sidewall shapes (sidewall structures) and their curved surfaces are oriented in opposite directions to each other.

Figure 8:
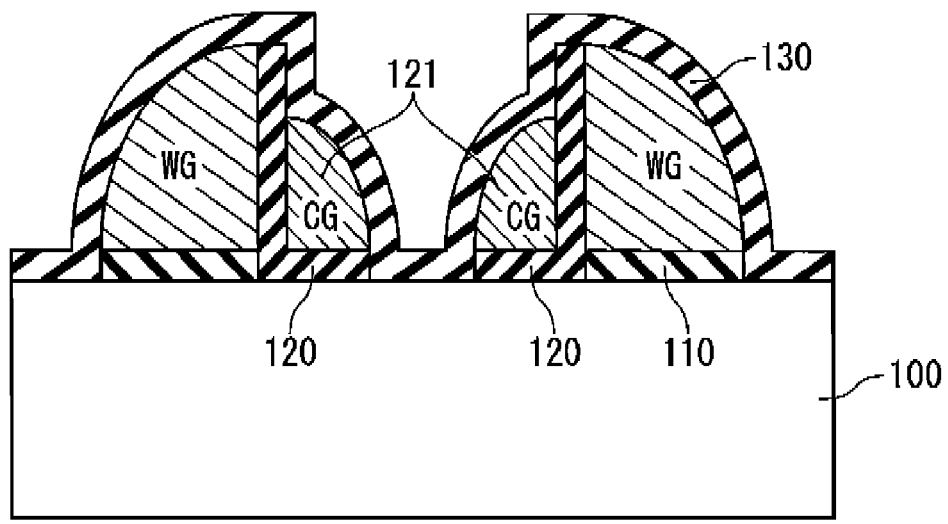
FIG. 8 is a sectional view showing the manufacturing process of the nonvolatile semiconductor memory according to the first exemplary embodiment.

Next, as shown in FIG. 8, unnecessary second gate insulating film 120 is removed by etching. As a result, the second gate insulating film 120 is changed to have an L shape surrounding the control gate CG. Subsequently, an insulating film 130 is blanket deposited by the CVD method. The insulating film 130 is an HTO (High-Temperature Oxide) film, for example.

Figure 9:
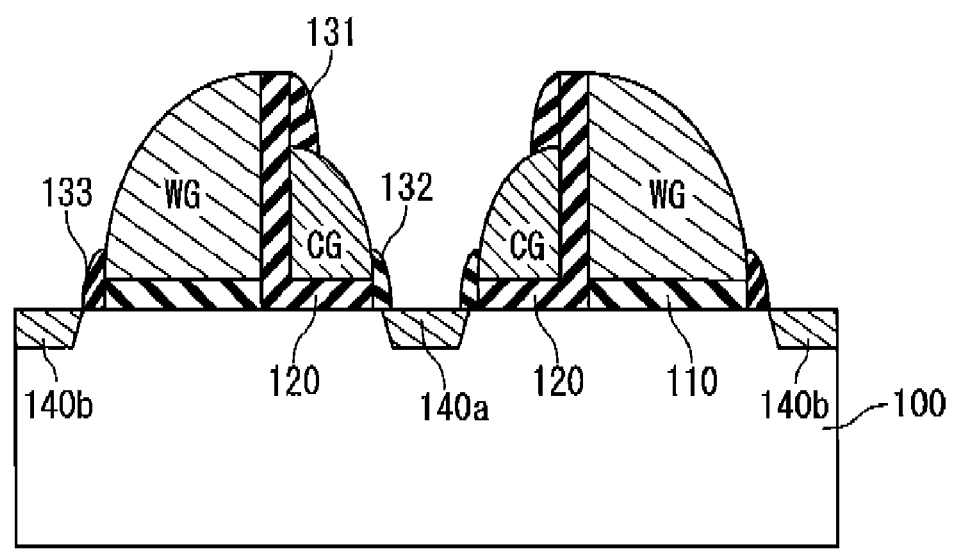
FIG. 9 is a sectional view showing the manufacturing process of the nonvolatile semiconductor memory according to the first exemplary embodiment.

Next, as shown in FIG. 9, a diffusion layer 140a and a diffusion layer 140b serving as source/drain are formed in the semiconductor substrate 100 by ion implantation. The diffusion layer 140a is formed in the semiconductor substrate 100 lateral to the control gate CG, and the diffusion layer 140b is formed in the semiconductor substrate 100 lateral to the word gate WG. Etching-hack of the above-mentioned insulating film 130 is performed so that sidewall insulators 131 to 133 are formed. The sidewall insulator 131 is formed on the control gate CG whose height is lower than the word gate WG. It should be noted that the sidewall insulator 131 is a different component from the second gate insulating film 120 interposed between the word gate WG and the control gate CG. The sidewall insulator 132 is formed between the control gate CG and the diffusion layer 140a and is in contact with the semiconductor substrate 100. The sidewall insulator 133 is formed between the word gate WG and the diffusion layer 140b and is in contact with the semiconductor substrate 100.

Figure 10:
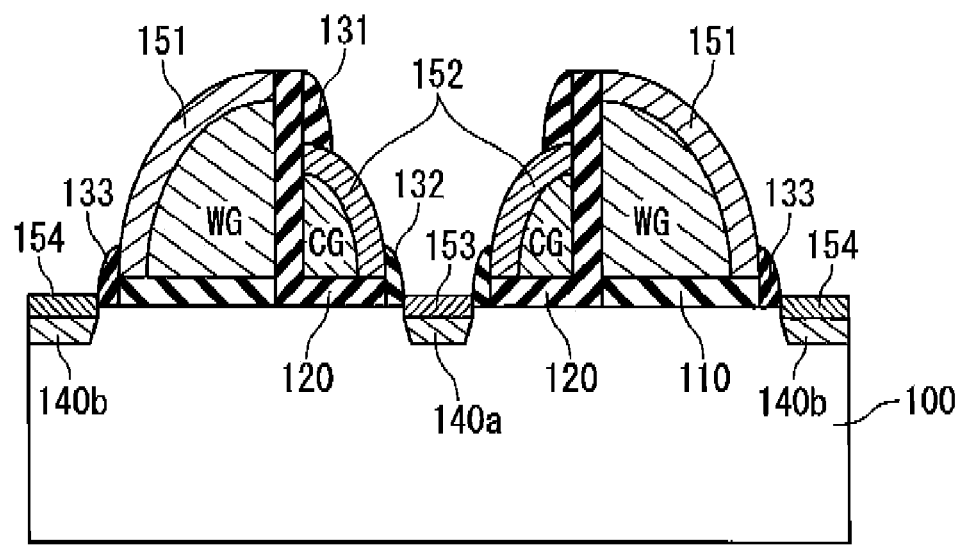
FIG. 10 is a sectional view showing the manufacturing process of the nonvolatile semiconductor memory according to the first exemplary embodiment.

Next, as shown in FIG. 10, respective upper surfaces of the word gate WG, the control gate CG, the diffusion layer 140a and the diffusion layer 140b are silicided simultaneously. For example, after a cobalt (Co) film is formed by sputtering, pre-sintering is performed. As a result, cobalt silicide films 151, 152, 153 and 154 are formed on the upper surfaces of the word gate WG, the control gate CG, the diffusion layer 140a and the diffusion layer 140b, respectively. After excessive cobalt and silicide are removed by etching, final sintering is performed under a higher temperature condition. As a result, final silicide films 151 to 154 are completed.

According to the present exemplary embodiment, the control gate CG is formed such that its uppermost portion is located below the uppermost portion of the word gate WG. Further, the sidewall insulator 131 is formed on the control gate CG. Accordingly, short-circuit between the silicide film 151 and the silicide film 152 is prevented at the silicidation process. Moreover, the sidewall insulator 132 is formed between the control gate CG and the diffusion layer 140a. Therefore, short-circuit between the silicide film 152 and the silicide film 153 is prevented at the silicidation process. Furthermore, the sidewall insulator 133 is formed between the word gate WG and the diffusion layer 140b. Therefore, short-circuit between the silicide film 151 and the silicide film 154 is prevented at the silicidation process.

Figure 11:
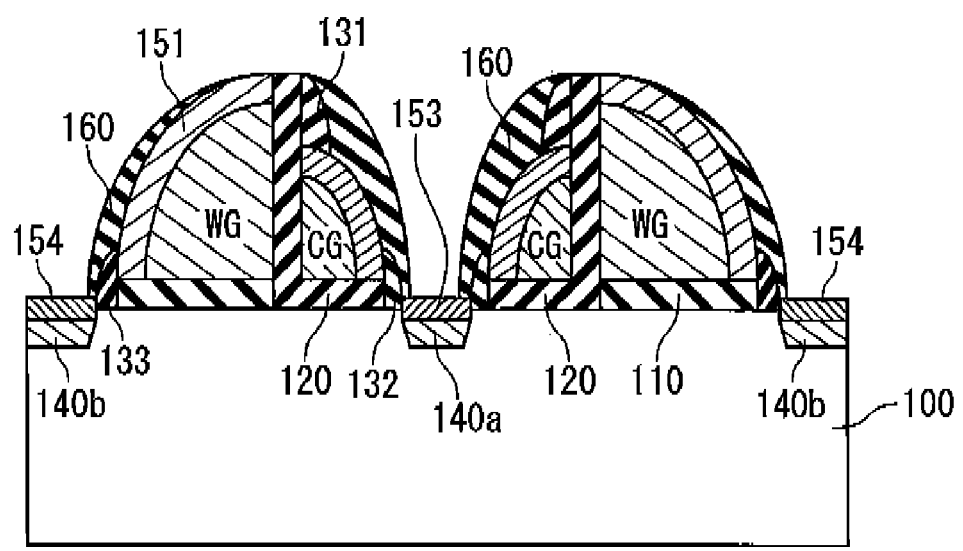
FIG. 11 is a sectional view showing the manufacturing process of the nonvolatile semiconductor memory according to the first exemplary embodiment.

Next, as shown in FIG. 11, after a protective insulating film 160 (for example, a SiN film) is blanket deposited, etching-back of the protective insulating film 160 is performed. The silicide film 151 and the silicide film 152 are covered with the protective insulating film 160.

Figure 12:
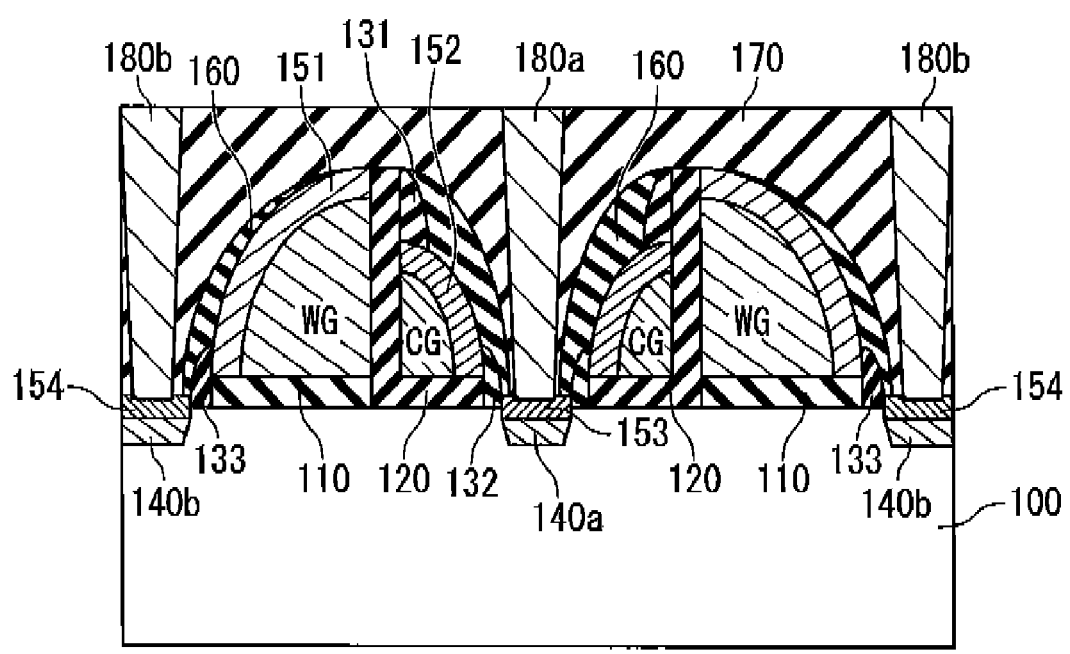
FIG. 12 is a sectional view showing the manufacturing process of the nonvolatile semiconductor memory according to the first exemplary embodiment.

Next, as shown in FIG. 12, an interlayer insulating film 170 is blanket deposited by the CVD method. Subsequently, the interlayer insulating film 170 is planarized by CMP (Chemical Mechanical Polishing). Further, contacts 180a and 180b penetrating through the interlayer insulating film 170 are formed by photolithography. The contact 180a is so formed as to connect to the silicide film 153 on the diffusion layer 140a, and the contact 180b is so formed as to connect to the silicide film 154 on the diffusion layer 140b. After that, word lines respectively connecting to the word gate WG and the control gate CG, bit lines respectively connecting to the contact 180a and the contact 180b, upper layer interconnections and the like are formed.

1-3. Effects

According to the present exemplary embodiment, the word gate WG and the control gate CG are formed in a self-aligned manner by the etching-back technique. Therefore, the area of the memory cell is reduced as compared with a case where the photolithography technique is used.

Moreover, according to the present exemplary embodiment, the upper surfaces of the control gate CG and the word gate WG are silicided. It is therefore possible to rapidly raise the potentials of the control gate CG and the word gate WG up to the predetermined read potentials. That is, the data read speed is improved.

Furthermore, according to the present exemplary embodiment, the sidewall insulators 131 to 133 are formed near the word gate WG and the control gate CG. As a result, short-circuit between silicide films close to each other is prevented.

2. Second Exemplary Embodiment 2-1. Structure

Figure 13:
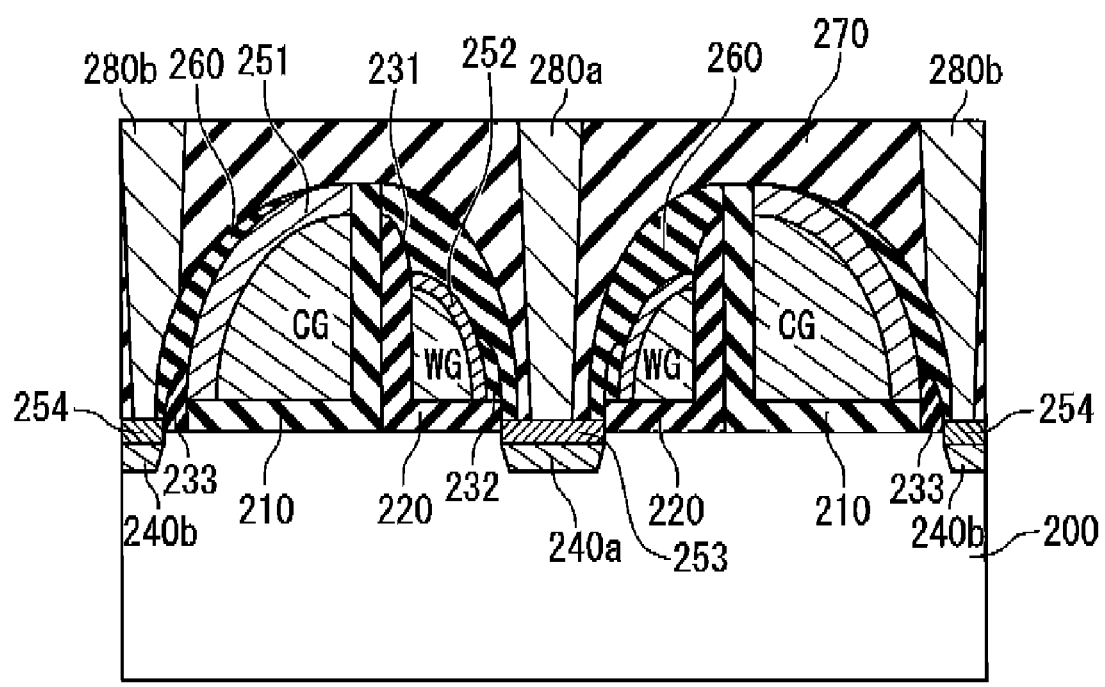
FIG. 13 is a sectional view showing a structure of a nonvolatile semiconductor memory according to a second exemplary embodiment of the present invention.

FIG. 13 is a sectional view showing a structural example of a nonvolatile semiconductor memory according to a second exemplary embodiment of the present invention. In a semiconductor substrate 200, a diffusion layer 240a and a diffusion layer 240b serving as source/drain are formed. For example, the semiconductor substrate 200 is a P-type silicon substrate (P-type well), and the diffusion layer 240a and the diffusion layer 240b are N-type diffusion layers. A semiconductor region between the diffusion layer 240a and the diffusion layer 240b is a channel region.

A control gate CG is formed on a part of the channel region through a first gate insulating film 210. A word gate WG is formed on another part of the channel region through a second gate insulating film 220. That is, the control gate CG and the ward gate WG are formed side by side on the channel region and they face each other across an insulating film. In the example shown in FIG. 13, the insulating film interposed between the control gate CG and the word gate WG is parts of the first gate insulating film 210 and the second gate insulating film 220. That is, the first gate insulating film 210 extends from between the control gate CG and the semiconductor substrate 200 to between the control gate CG and the word gate WG, and the second gate insulating film 220 extends between the word gate WG and the semiconductor substrate 200 to between the word gate WG and the control gate CG.

Moreover, both the control gate CG and the ward gate WG have sidewall shapes (sidewall structures). As described later, this results from a fact that the control gate CG and the word gate WG are formed by etching-back technique. In the example shown in FIG. 13, an upper surface of the control gate CG is curved and comes down (comes closer to the semiconductor substrate 200) as away from the word gate WG. Similarly, an upper surface of the word gate WG also is curved and comes down as away from the control gate CG.

That is, respective curved surfaces of the control gate CG and the word gate WG having the sidewall shapes are oriented in opposite directions to each other. In the example shown in FIG. 13, the uppermost portion of the word gate WG is located below the uppermost portion of the control gate CG.

In the present exemplary embodiment, respective upper surfaces of the control gate CG, the word gate WG, the diffusion layer 240a and the diffusion layer 240b are silicided. Specifically, a silicide film 251 is formed on the upper surface of the control gate CG, and a silicide film 252 is formed on the upper surface of the word gate WG. For example, the control gate CG and the word gate WG are made of polysilicon, and the silicide films 251 and 252 are cobalt silicide (CoSi) films. Further, a suicide film 253 is formed on the diffusion layer 240a and silicide film 254 is formed on the diffusion layer 240b. For example, the silicide films 253 and 254 are cobalt silicide films.

Furthermore, an insulator 231 is formed between the silicide film 251 on the control gate CG and the silicide film 252 on the word gate WG. It should be noted that the insulator 231 is a different component from the first gate insulating film 210 interposed between the control CG and the word gate WG. That is, the insulator 231 is separately formed by a process different from a process for forming the first gate insulating film 210. In the example shown in FIG. 13, the insulating film 231 has a sidewall shape (sidewall structure), and it is hereinafter referred to as a "sidewall insulator 231". The sidewall insulator 231 is formed on the word gate WG whose height is lower than the control gate CG. As described later, the sidewall insulator 231 formed between the suicide film 251 and the silicide film 252 is effective for preventing short-circuit between the silicide film 251 and the silicide film 252.

Furthermore, an insulator 232 is formed between the silicide film 252 on the word gate WG and the silicide film 253 on the diffusion layer 240a. Furthermore, an insulator 233 is formed between the silicide film 251 on the control gate CG and the silicide film 254 on the diffusion layer 240b. Each of the insulator 232 and the insulator 233 also has a sidewall shape (sidewall structure) similarly to the above-mentioned sidewall insulator 231, and is hereinafter referred to as a "sidewall insulator". In the example shown in FIG. 13, the sidewall insulator 233 is so formed as to be in contact with the semiconductor substrate 200. As described later, the sidewall insulator 232 is effective for preventing short-circuit between the silicide film 252 and the silicide film 253, and the sidewall insulator 233 is effective for preventing short-circuit between the silicide film 251 and the silicide film 254.

A protective insulating film 260 is so formed as to cover the silicide film 251 and the silicide film 252. Further, an interlayer insulating film 270 is so formed as to cover the whole. A contact 280a is formed to penetrate through the interlayer insulating film 270 to electrically connect to the silicide film 253 on the insulating layer 240a. A contact 280b is formed to penetrate through the interlayer insulating film 270 to electrically connect to the silicide film 254 on the diffusion layer 240b. The contact 280a and the contact 280b are connected to bit lines.

In the present exemplary embodiment, the first gate insulating film 210 on the side of the control gate CG is a charge trapping film which traps charges. For example, the first gate insulating film 210 is an ONO film formed by laminating a silicon oxide film, a silicon nitride film and a silicon oxide film in this order. In this case, the control gate CG serves as a gate electrode of a MONOS transistor. In a case where charges are trapped in the ONO film, the threshold voltage of the MONOS transistor is increased as compared with a case where charges are not trapped in the ONO film. By utilizing such change in the threshold voltage, the memory cell according to the present exemplary embodiment can nonvolatilely store data "1" and "0". In FIG. 13, memory cells corresponding to two bits are shown.

Electron injection into the ONO film is achieved by the CHE method. When appropriate, potentials are respectively applied to the semiconductor substrate 200, the word gate WG, the control gate CG, the diffusion layer 240a and the diffusion layer 240b, electrons move from the diffusion layer 240a (the source) toward the diffusion layer 240b (the drain). Electrons in the channel region are accelerated by intense electric field between the word gate WG and the control gate CG and intense electric field near the drain to be channel hot electrons. Some of the generated channel hot electrons are injected into the ONO film below the control gate CG. As a result, the threshold voltage of the MONOS transistor is increased.

In order to lower the threshold voltage, electrons are drawn out from the ONO film or holes are injected into the ONO film. In the present exemplary embodiment, for example, holes are injected into the ONO film (HHI: Hot Hole Injection method). In this case, a negative potential is applied to the control gate CG and a positive potential is applied to the diffusion layer 240b, so that intense electric field is generated between the control gate CG and the diffusion layer 240b. When the intense electric field is applied to a depletion layer around an edge portion of the diffusion layer 240b, the band-to-band tunnel phenomenon is generated in the depletion layer. Due to the band-to-band tunnel phenomenon, electron-hole pairs are generated in the depletion layer where no carriers originally exist. Electrons of the electron-hole pairs are attracted toward the diffusion layer 240b. On the other hand, holes of the electron-hole pairs are attracted toward the channel region by a depletion layer electric field. At this time, the holes are accelerated by the depletion layer electric field to be hot holes. The hot holes having high energy are attracted to the negative potential of the control gate CG to be injected into the ONO film below the control gate CG. As a result, the threshold voltage of the MONOS transistor is decreased.

At the time of data reading from the memory cell, appropriate read potentials are respectively applied to the semiconductor substrate 200, the word gate WG, the control gate CG, the diffusion layer 240a and the diffusion layer 240b. In a case where the threshold voltage is high, the MONOS transistor remains at the OFF state and the channel is non-conductive. On the other hand, in a case where the threshold voltage is low, the MONOS transistor is turned ON, and electrons move from the diffusion layer 240b (the source) toward the diffusion layer 240a (the drain). Therefore, the data stored in the memory cell can be determined based upon magnitude of a read current flowing through a bit line connecting to the source or the drain. Since the upper surfaces of the control gate CG and the word gate WG are silicided, the data read speed is improved.

2-2. Manufacturing Method

Next, a manufacturing method of the nonvolatile semiconductor memory according to the present exemplary embodiment will be described. FIGS. 14 to 24 are sectional views showing an example of manufacturing processes of the structure shown in FIG. 13.

Figure 14:
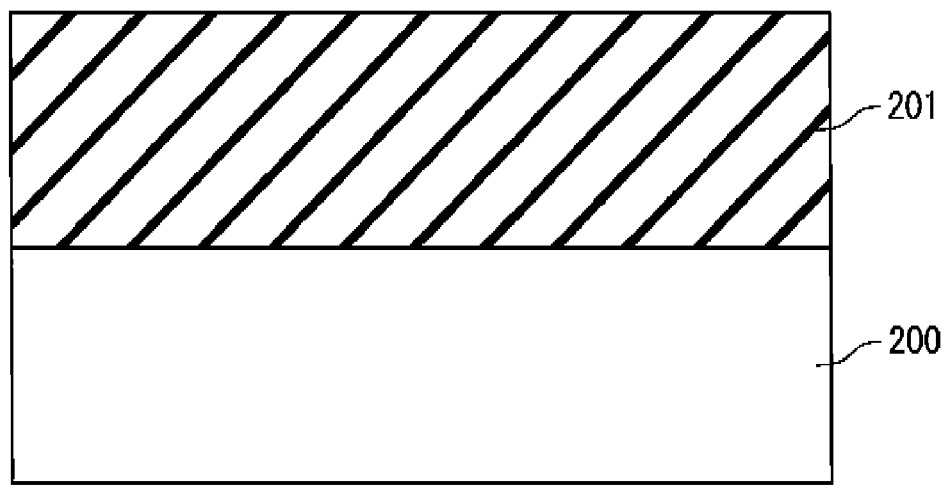
FIG. 14 is a sectional view showing a manufacturing process of the nonvolatile semiconductor memory according to the second exemplary embodiment.

As shown in FIG. 14, first, an insulating film 201 is formed on a semiconductor substrate 200. For example, the semiconductor substrate 200 is a P-type silicon substrate (P-type well), and the insulating film 201 is a $SiO_2$ film.

Figure 15:
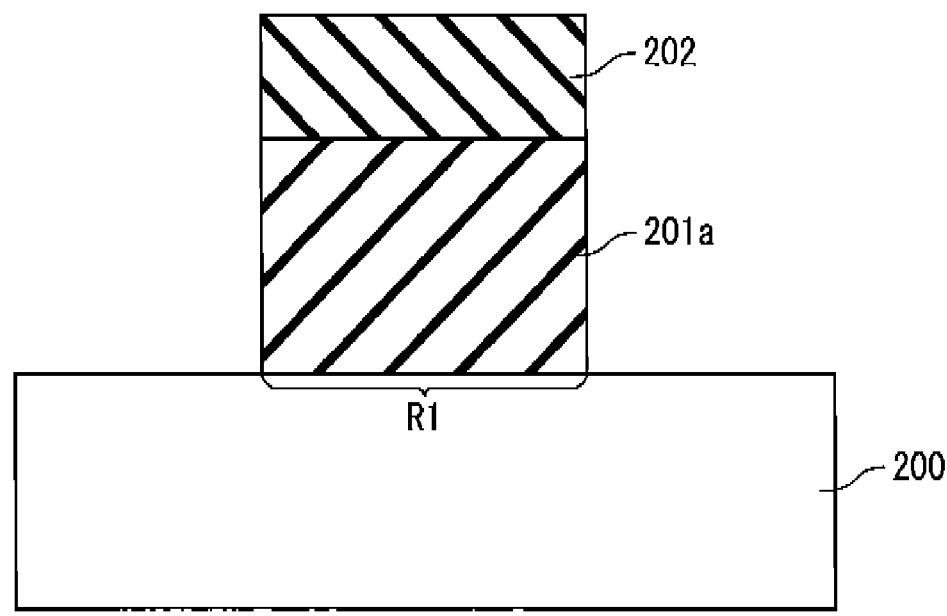
FIG. 15 is a sectional view showing the manufacturing process of the nonvolatile semiconductor memory according to the second exemplary embodiment.

Next, as shown in FIG. 15, a photoresist 202 having a predetermined pattern is formed on the insulating film 201, and the insulating film 201 is etched using the photoresist 202. As a result, an insulator structure 201a composed of the insulating film 201 is formed on the semiconductor substrate 200 in a region R1. Thereafter, the photoresist 202 is removed.

Figure 16:
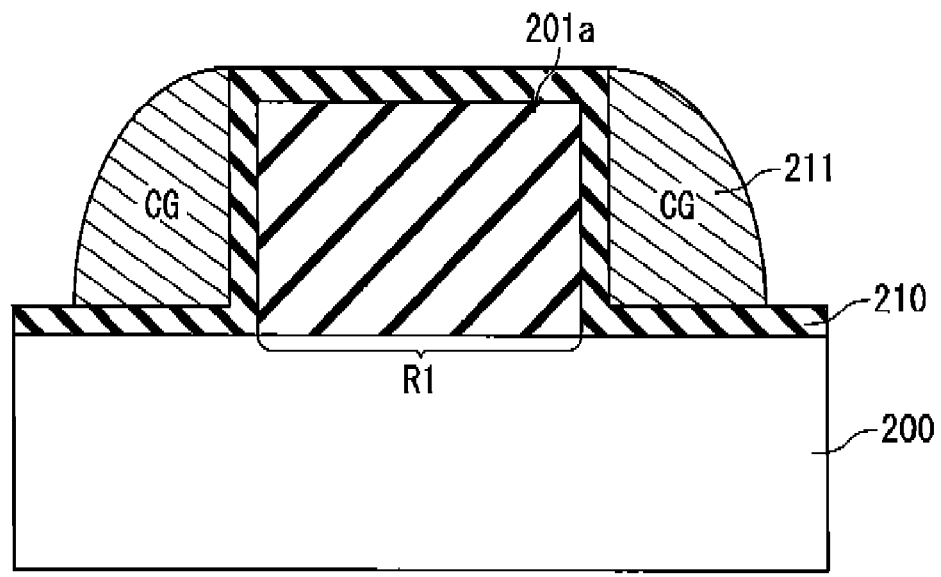
FIG. 16 is a sectional view showing the manufacturing process of the nonvolatile semiconductor memory according to the second exemplary embodiment.

Next, as shown in FIG. 16, a first gate insulating film 210 which is a charge trapping film is blanket formed. For example, the first gate insulating film 210 is an ONO film and it is formed by laminating a silicon oxide film, a silicon nitride film and a silicon oxide film in this order by the CVD method. At this time, the first gate insulating film 210 is formed on the semiconductor substrate 200 outside the region R1. Subsequently, a first polysilicon film (first gate material film) 211 is blanket deposited by the CVD method. The first polysilicon film 211 is a material film for the control gate CG. Subsequently, etching-back of the first polysilicon film 211 is performed. As a result, the control gate CG having a sidewall shape is formed on the first gate insulating film 210 lateral to the insulator structure 201a.

Figure 17:
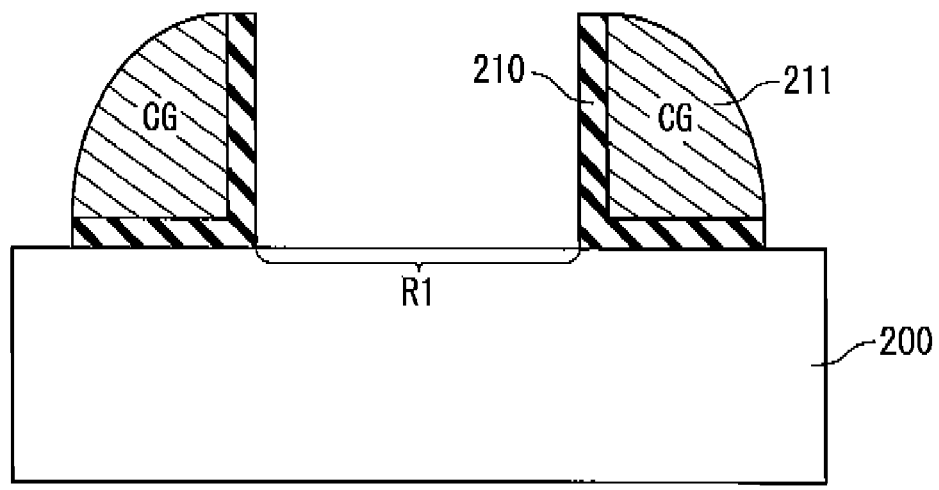
FIG. 17 is a sectional view showing the manufacturing process of the nonvolatile semiconductor memory according to the second exemplary embodiment.

Next, as shown in FIG. 17, unnecessary first gate insulating film 210 is removed by etching. As a result, the first gate insulating film 210 is changed to have an L shape surrounding the control gate CG. Furthermore, the insulator structure 201a in the region R1 is removed by wet-etching.

Figure 18:
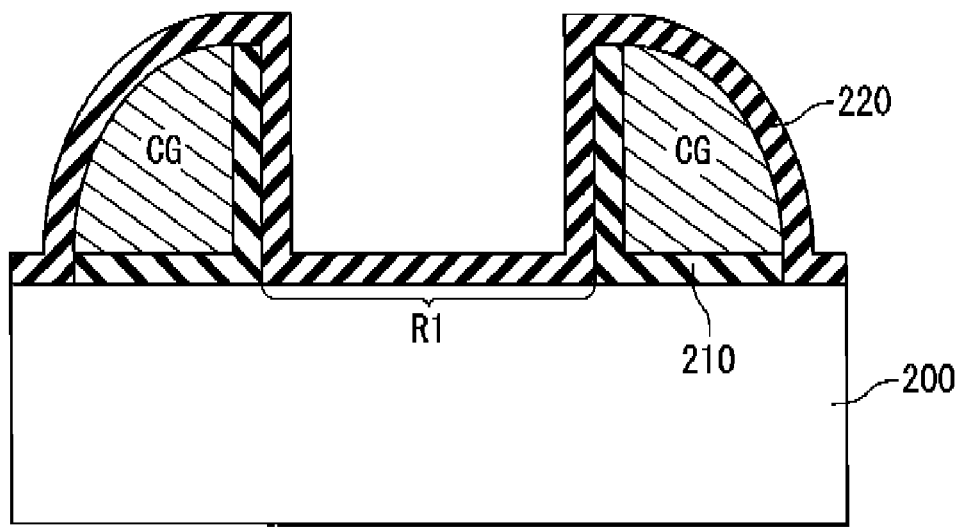
FIG. 18 is a sectional view showing the manufacturing process of the nonvolatile semiconductor memory according to the second exemplary embodiment.

Next, as shown in FIG. 18, a second gate insulating film 220 is blanket deposited by the CVD method. For example, the second gate insulating film 220 is a $SiO_2$ film.

Figure 19:
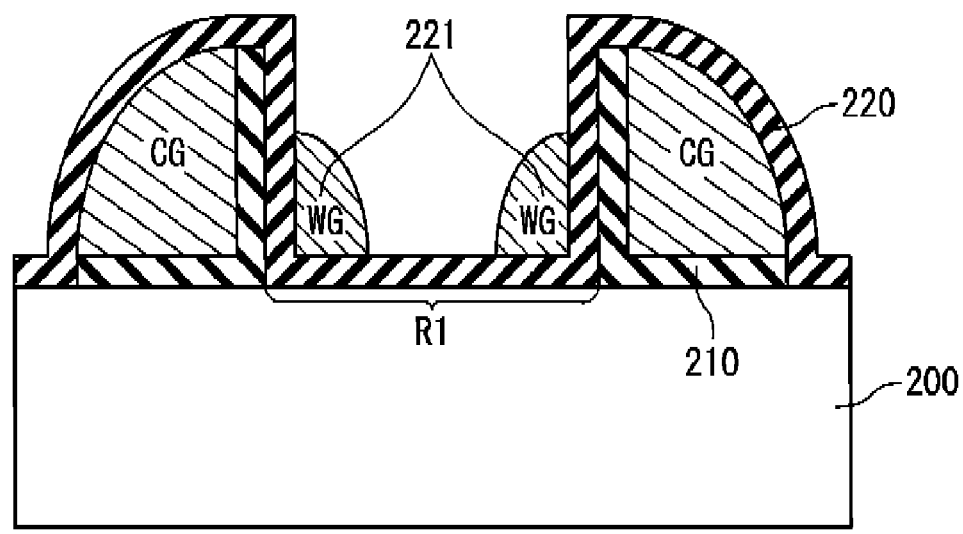
FIG. 19 is a sectional view showing the manufacturing process of the nonvolatile semiconductor memory according to the second exemplary embodiment.

Next, a second polysilicon film (second gate material film) 221 is blanket deposited by the CVD method. The second polysilicon film 221 is a material film for the word gate WG. Subsequently, etching-back of the second polysilicon film 221 is performed. As a result, as shown in FIG. 19, the word gate WG having a sidewall shape is formed on the second gate insulating film 220 within the above-mentioned region R1. As shown in FIG. 19, the word gate WG is formed such that its uppermost portion is located below the uppermost portion of the control gate CG.

Thus, the control gate CG and the word gate WG facing each other across the first gate insulating film 210 and the second gate insulating film 220 are formed in a self-aligned manner by the etch-back technique. Both the control gate CG and the word gate WG have sidewall shapes (sidewall structures) and their curved surfaces are oriented in opposite directions to each other.

Figure 20:
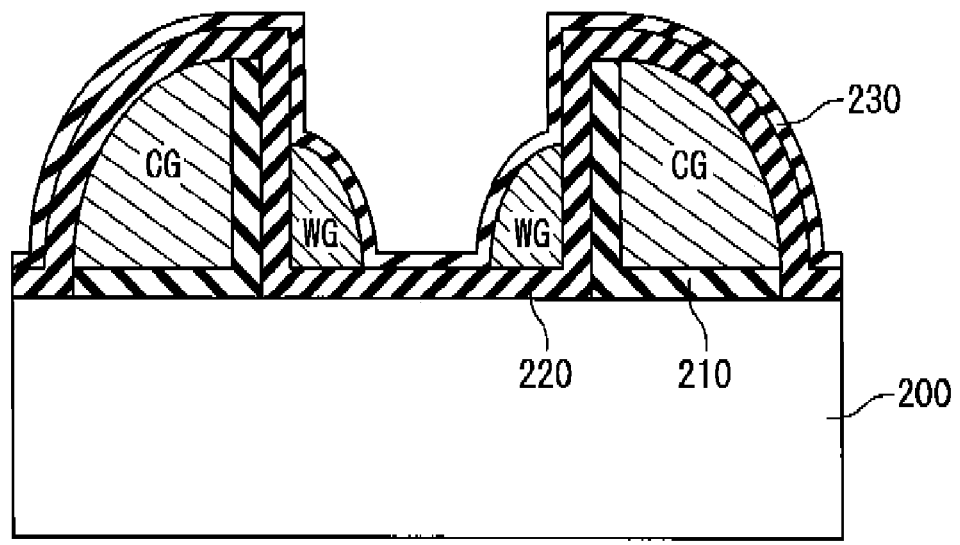
FIG. 20 is a sectional view showing the manufacturing process of the nonvolatile semiconductor memory according to the second exemplary embodiment.

Next, as shown in FIG. 20, an insulating film 230 is blanket deposited by the CVD method. The insulating film 230 is an HTO film ($SiO_2$ film).

Figure 21:
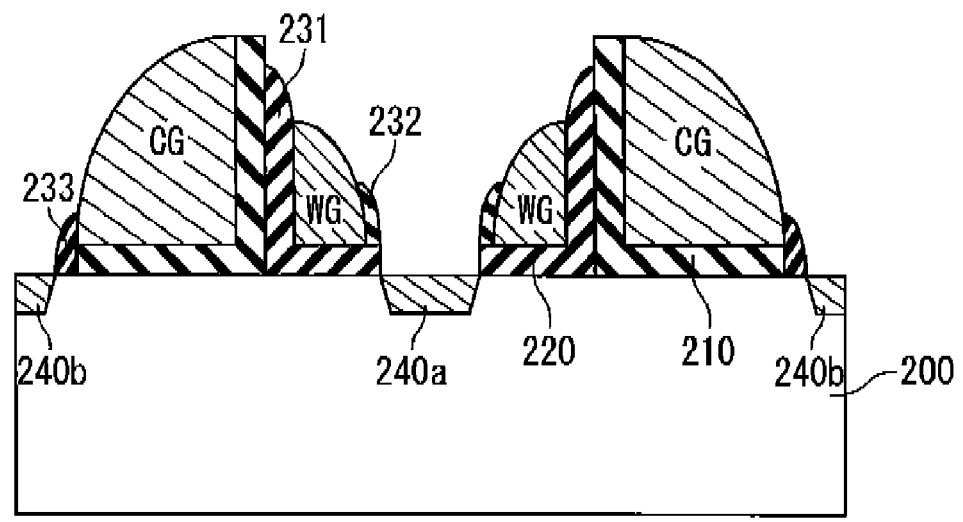
FIG. 21 is a sectional view showing the manufacturing process of the nonvolatile semiconductor memory according to the second exemplary embodiment.

Next, as shown in FIG. 21, a diffusion layer 240a and a diffusion layer 240b serving as source/drain are formed in the semiconductor substrate 200 by ion implantation. The diffusion layer 240a is formed in the semiconductor substrate 200 lateral to the word gate WG, and the diffusion layer 240b is formed in the semiconductor substrate 200 lateral to the control gate CG. Etching-back of the above-mentioned $SiO_2$ films (the insulating film 230 and the second gate insulating film 220) is performed so that sidewall insulators 231 to 233 are formed. The sidewall insulator 231 is formed on the word gate WG whose height is lower than the control gate CG. The sidewall, insulator 232 is formed between the word gate WG and the diffusion layer 240a. The sidewall insulator 233 is formed between the control gate CG and the diffusion layer 240b.

Figure 22:
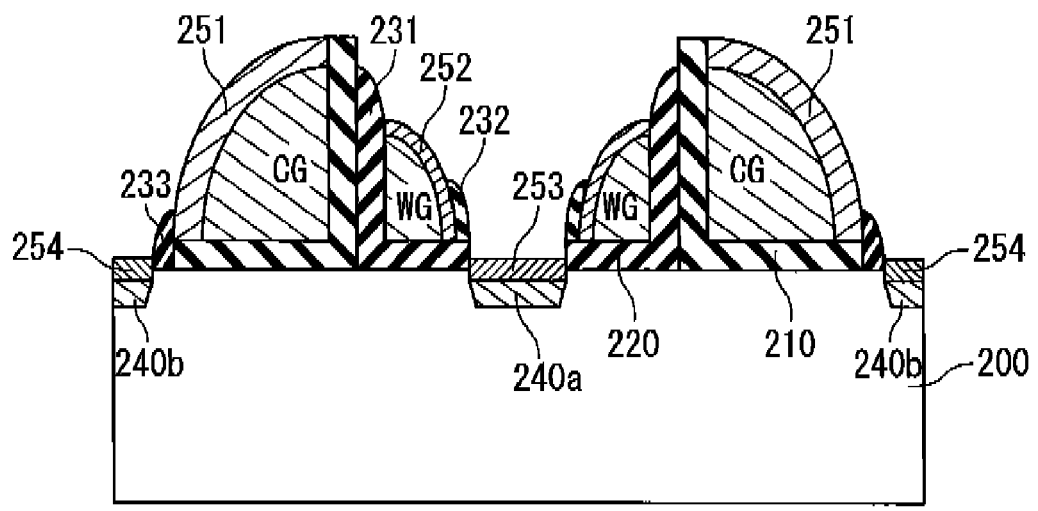
FIG. 22 is a sectional view showing the manufacturing process of the nonvolatile semiconductor memory according to the second exemplary embodiment.

Next, as shown in FIG. 22, respective upper surfaces of the control gate CG, the word gate WG, the diffusion layer 240a and the diffusion layer 240b are silicified simultaneously. For example, after a cobalt (Co) film is formed by sputtering, pre-sintering is performed. As a result, cobalt silicide films 251, 252, 253 and 254 are formed on the upper surfaces of the control gate CG, the word gate WG, the diffusion layer 240a and the diffusion layer 240b, respectively. After excessive cobalt and silicide are removed by etching, the sintering is performed under a higher temperature condition. As a result, final silicide films 251 to 254 are completed.

According to the present exemplary embodiment, the word gate WG is formed such that its uppermost portion is located below the uppermost portion of the control gate CG. Further, the sidewall insulator 231 is formed on the word gate WG. Accordingly, short-circuit between the silicide film 251 and the silicide film 252 is prevented at the silicidation process. Further, the sidewall insulator 232 is formed between the word gate WG and the diffusion layer 240a. Therefore, short-circuit between the silicide film 252 and the silicide film 253 is prevented at the silicidation process. Furthermore, the sidewall insulator 233 is formed between the control gate CG and the diffusion layer 240b. Therefore, short-circuit between the silicide film 251 and the silicide film 254 is prevented at the silicidation process.

Figure 23:
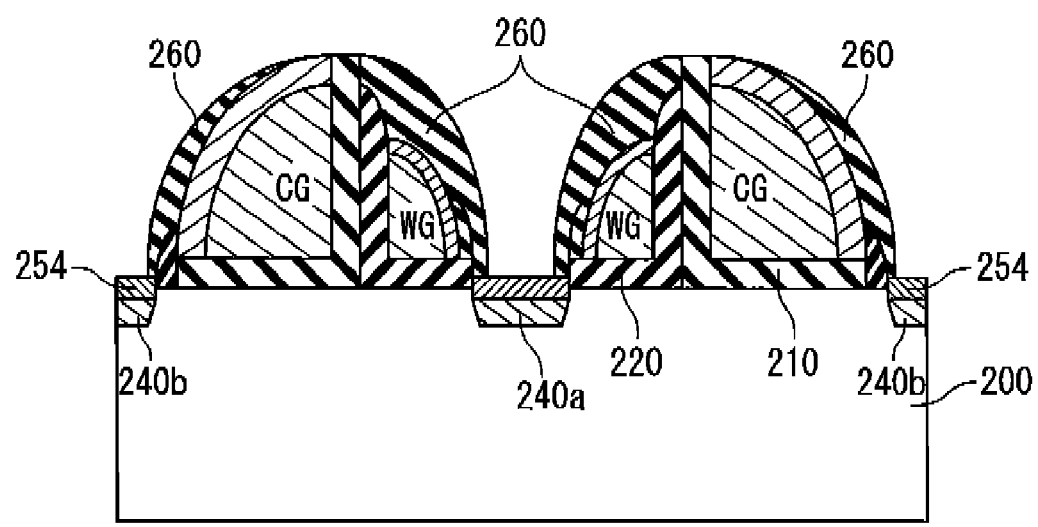
FIG. 23 is a sectional view showing the manufacturing process of the nonvolatile semiconductor memory according to the second exemplary embodiment.

Next, as shown in FIG. 23, after a protective insulating film 260 (for example, a SiN film) is blanket deposited, etching-back of the protective insulating film 260 is performed. The silicide film 251 and the silicide film 252 are covered with the protective insulating film 260.

Figure 24:
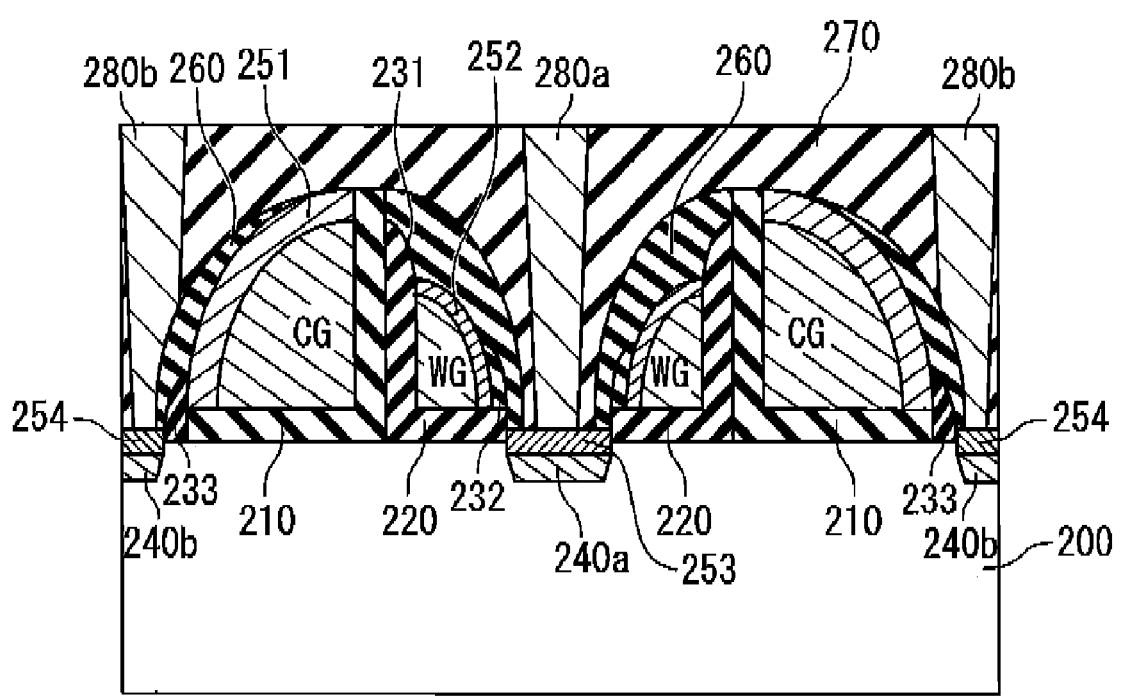
FIG. 24 is a sectional view showing the manufacturing process of the nonvolatile semiconductor memory according to the second exemplary embodiment.

Next, as shown in FIG. 24, an interlayer insulating film 270 is blanket deposited by the CVD method. Subsequently, the interlayer insulating film 270 is planarized by CMP. Further, contacts 280a and 280b penetrating through the interlayer insulating film 270 are formed by photolithography. The contact 280a is so formed as to connect to the silicide film 253 on the diffusion layer 240a, and the contact 280b is so formed as to connect to the silicide film 254 on the diffusion layer 240b. After that, word lines respectively connecting to the word gate WG and the control gate CG, bit lines respectively connecting to the contact 280a and the contact 280b, upper layer interconnections and the like are formed.

2-3. Effects

According to the present exemplary embodiment, the word gate WG and the control gate CG are formed in a self-aligned manner by the etching-back technique. Therefore, the area of the memory cell is reduced as compared with a case where the photolithography technique is used.

Moreover, according to the present exemplary embodiment, the upper surfaces of the control gate CG and the word gate WG are silicided. It is therefore possible to rapidly raise the potentials of the control gate CG and the word gate WG up to the predetermined read potentials. That is, the data read speed is improved.

Furthermore, according to the present exemplary embodiment, the sidewall insulators 231 to 233 are formed near the word gate WG and the control gate CG. As a result, short-circuit between silicide films close to each other is prevented.

3. Third Exemplary Embodiment

3-1. Structure

Figure 25:
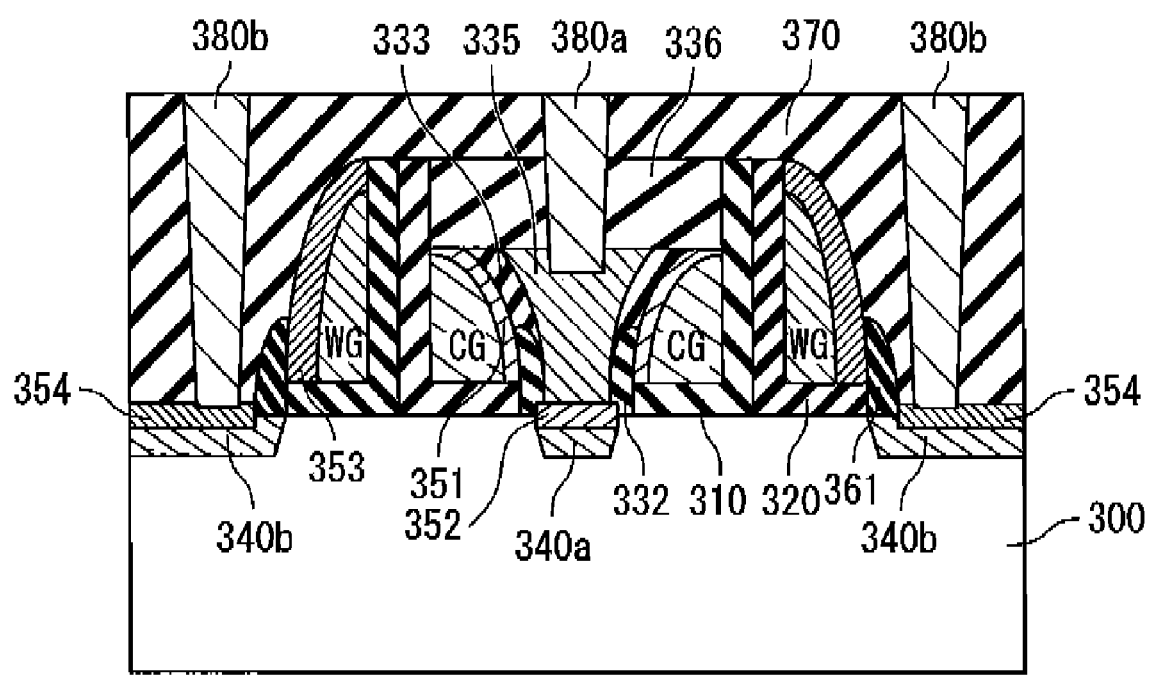
FIG. 25 is a sectional view showing a structure of a nonvolatile semiconductor memory according to a third exemplary embodiment of the present invention.

FIG. 25 is a sectional view showing a structural example of a nonvolatile semiconductor memory according to a third exemplary embodiment of the present invention. In a semiconductor substrate 300, a diffusion layer 340a and a diffusion layer 340b serving as source/drain are formed. For example, the semiconductor substrate 300 is a P-type silicon substrate (P-type well), and the diffusion layer 340a and the diffusion layer 340b are N-type diffusion layers. A semiconductor region between the diffusion layer 340a and the diffusion layer 340b is a channel region.

A control gate CG is formed on a part of the channel region through a first gate insulating film 310. A word gate WG is formed on another part of the channel region through a second insulating film 320. That is, the control gate CG and the ward gate WG are arranged side by side on the channel region and they face each other across an insulating film. In the example shown in FIG. 25, the insulating film interposed between the control gate CG and the word gate WG is parts of the first gate insulating film 310 and the second gate insulating film 320. That is, the first insulating film 310 extends from between the control gate CG and the semiconductor substrate 300 to between the control gate CG and the word gate WG, and the second insulating film 320 extends between the word gate WG and the semiconductor substrate 300 to between the word gate WG and the control gate CG.

Moreover, both the control gate CG and the ward gate WG have sidewall shapes (sidewall structures). As described later, this results from a fact that the control gate CG and the word gate WG are formed by etching-back technique. In the example shown in FIG. 25, an upper surface of the control gate CG is curved and comes down (comes closer to the semiconductor substrate 300) as away from the word gate WG. Similarly, an upper surface of the word gate WG also is curved and comes down as away from the control gate CG. That is, respective curved surfaces of the control gate CG and the word gate WG having the sidewall shapes are oriented in opposite directions to each other. In the example shown in FIG. 25, the uppermost portion of the control gate CG is located below the uppermost portion of the word gate WG.

In the present exemplary embodiment, respective upper surfaces of the control gate CG, the word gate WG, the diffusion layer 340a and the diffusion layer 340b are silicided. Specifically, a silicide film 351 is formed on the upper surface of the control gate CG, and a silicide film 353 is formed on the upper surface of the word gate WG. For example, the control gate CG and the word gate WG are made of polysilicon, and the silicide films 351 and 353 are cobalt silicide (CoSi) films. Further, a silicide film 352 is formed on the diffusion layer 340a and a silicide film 354 is formed on the diffusion layer 340b. For example, the silicide films 352 and 354 are cobalt silicide films.

Furthermore, an insulator 332 is formed between the silicide film 351 on the control gate CG and the silicide film 352 on the diffusion layer 340a. Furthermore, an insulator 361 is formed between the silicide film 353 on the word gate WG and the silicide film 354 on the diffusion layer 340b. In the example shown in FIG. 25, each of the insulator 332 and the insulator 361 has a sidewall shape (sidewall structure), and it is hereinafter referred to as a "sidewall insulator". The sidewall insulators 332 and 361 are so formed as to be in contact with the semiconductor substrate 300. As described later, the sidewall insulator 332 is effective for preventing short-circuit between the silicide film 351 and the silicide film 352, and the sidewall insulator 361 is effective for preventing short-circuit between the silicide film 353 and the silicide film 354.

A protective insulating film 333 is so formed as to cover the silicide film 351. A plug 335 is formed on the silicide film 352 and the protective insulating film 333. That is, the protective insulating film 333 is interposed between the silicide film 351 and the plug 335. The plug 335 is a DOPOS (Doped Polysilicon) film, for example. An upper surface of the plug 335 is located below the uppermost portion of the word gate WG. An insulating film 336 is formed on the plug 335.

Furthermore, an interlayer insulating film 370 is formed to cover the whole. A contract 380a is so formed as to penetrate through the interlayer insulating film 370 and the insulating film 336 to connect to the plug 335. That is, the contact 380a is electrically connected to the silicide film 352 on the diffusion layer 340a. The contact 380b is so formed as to penetrate through the interlayer insulating film 370 to electrically connect to the silicide film 354 on the diffusion layer 340b. The contact 380a and the contact 380b are connected to bit lines.

In the present exemplary embodiment, the first gate insulating film 310 on the side of the control gate CG is a charge trapping film which traps charges. For example, the first gate insulating film 310 is an ONO film formed by laminating a silicon oxide film, a silicon nitride film and a silicon oxide film in this order. In this case, the control gate CG serves as a gate electrode of a MONOS transistor. In a case where charges are trapped in the ONO film, the threshold voltage of the MONOS transistor is increased as compared with a case where charges are not trapped in the ONO film. By utilizing such change in the threshold voltage, the memory cell according to the present exemplary embodiment can nonvolatilely store data "1" and "0". In FIG. 25, memory cells corresponding to two bits are shown.

Electron injection into the ONO film is achieved by the CHE method. When appropriate potentials are respectively applied to the semiconductor substrate 300, the word gate WG, the control gate CG, the diffusion layer 340a and the diffusion layer 340b, electrons move from the diffusion layer 340b (the source) toward the diffusion layer 340a (the drain). Electrons in the channel region are accelerated by intense electric field between the word gate WG and the control gate CG and intense electric field near the drain to be channel hot electrons. Some of the generated channel hot electrons are injected into the ONO film below the control gate CG. As a result, the threshold voltage of the MONOS transistor is increased.

In order to lower the threshold voltage, electrons are drawn out from the ONO film or holes are injected into the ONO film. In the present exemplary embodiment, for example, holes are injected into the ONO film (HHI: Hot Hole Injection method). In this case, a negative potential is applied to the control gate CG and a positive potential is applied to the diffusion layer 340a, so that intense electric field is generated between the control gate CG and the diffusion layer 340a. When the intense electric field is applied to a depletion layer around an edge portion of the diffusion layer 340a, the band-to-band tunnel phenomenon is generated in the depletion layer. Due to the band-to-band tunnel phenomenon, electron-hole pairs are generated in the depletion layer where no carriers originally exist. Electrons of the electron-hole pairs are attracted toward the diffusion layer 340a. On the other hand, holes of the electron-hole pairs are attracted toward the channel region by a depletion layer electric field. At this time, the holes are accelerated by the depletion layer electric field to be hot holes. The hot holes having high energy are attracted to the negative potential of the control gate CG to be injected into the ONO film below the control gate CG. As a result, the threshold voltage of the MONOS transistor is decreased.

At the time of data reading from the memory cell, appropriate read potentials are respectively applied to the semiconductor substrate 300, the word gate WG, the control gate CG, the diffusion layer 340a and the diffusion layer 340b. In a case where the threshold voltage is high, the MONOS transistor remains at the OFF state and the channel is non-conductive. On the other hand, in a case where the threshold voltage is low, the MONOS transistor is turned ON, and electrons move from the diffusion layer 340a (the source) toward the diffusion layer 340b (the drain). Therefore, the data stored in the memory cell can be determined based upon magnitude of a read current flowing through a bit line connecting to the source or the drain. Since the upper surfaces of the control gate CG and the word gate WG are silicided, the data read speed is improved.

3-2. Manufacturing Method

Next, a manufacturing method of the nonvolatile semiconductor memory according to the present exemplary embodiment will be described. FIGS. 26 to 40 are sectional views showing an example of manufacturing processes of the structure shown in FIG. 25.

Figure 26:
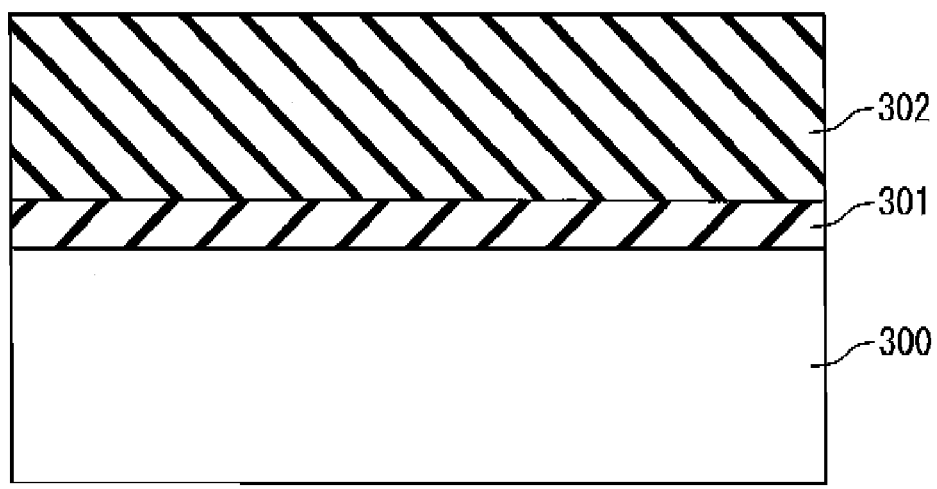
FIG. 26 is a sectional view showing a manufacturing process of the nonvolatile semiconductor memory according to the third exemplary embodiment.

As shown in FIG. 26, first, an insulating film 301 is formed on a semiconductor substrate 300. For example, the semiconductor substrate 300 is a P-type silicon substrate (P-type well), and the insulating film 301 is a $SiO_2$ film formed by thermal oxidation method. Further, an insulating film 302 is formed on the insulating film 301. For example, the insulating film 302 is a SiN film formed by the CVD method.

Figure 27:
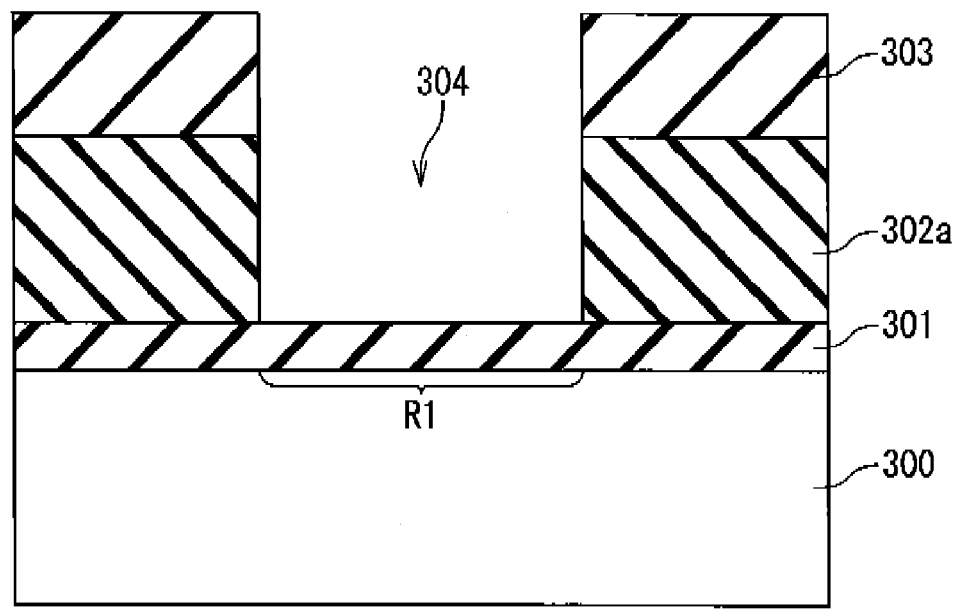
FIG. 27 is a sectional view showing the manufacturing process of the nonvolatile semiconductor memory according to the third exemplary embodiment.
Figure 28:
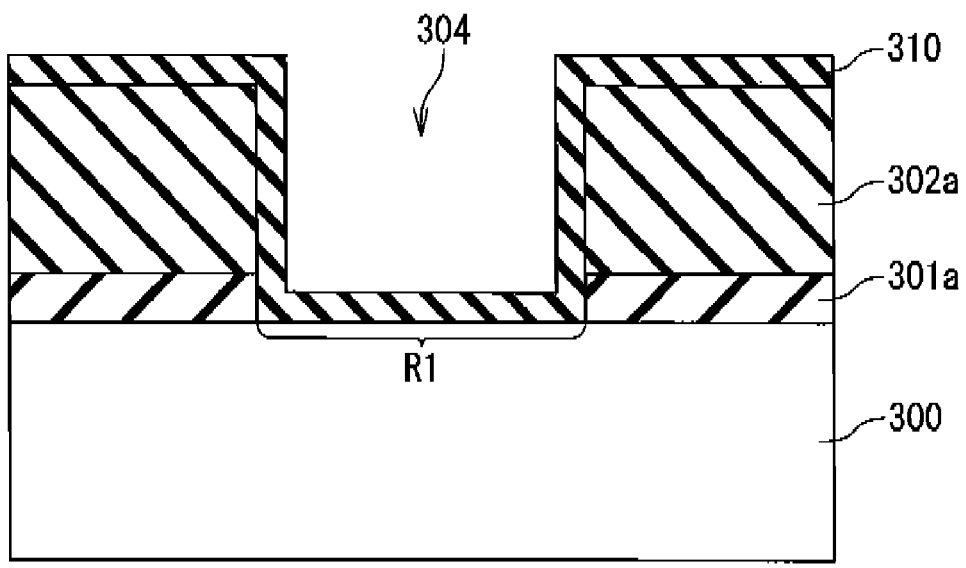
FIG. 28 is a sectional view showing the manufacturing process of the nonvolatile semiconductor memory according to the third exemplary embodiment.

Next, as shown in FIG. 27, a photoresist 303 having an opening portion in a region R1 is formed on the insulating film 302. The insulating film 302 is etched by using the photoresist 303. As a result, an insulator structure 302a having a trench 304 in the region R1 is formed. Thereafter, the photoresist 303 is removed. Further, the insulating film 301 in the region R1 is removed by wet-etching using the insulator structure 302a as a mask. As a result, as shown in FIG. 28, an insulator structure (301a, 302a) is formed on the semiconductor substrate 300. The insulator structure (301a, 302a) has the trench 304 reaching the semiconductor substrate 300 in the region R1.

Next, as shown in FIG. 28, a first gate insulating film 310 which is a charge trapping film is blanket formed. For example, the first gate insulating film 310 is an ONO film and it is formed by laminating a silicon oxide film, a silicon nitride film and a silicon oxide film in this order by the CVD method. At this time, the first gate insulating film 310 is formed on the semiconductor substrate 300 in the trench 304.

Figure 29:
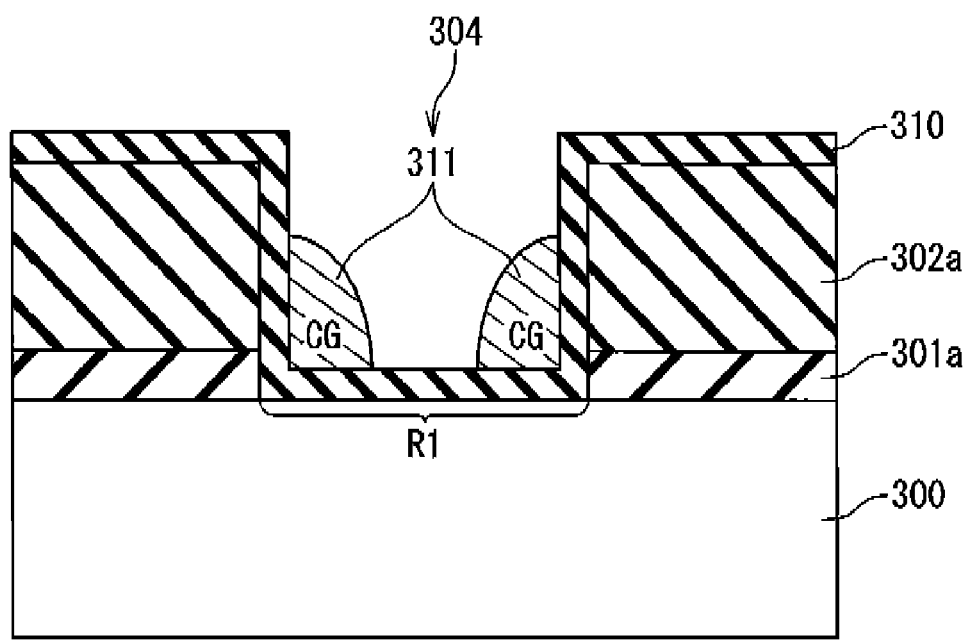
FIG. 29 is a sectional view showing the manufacturing process of the nonvolatile semiconductor memory according to the third exemplary embodiment.

Next, a first polysilicon film (first gate material film) 311 is blanket deposited by the CVD method. The first polysilicon film 311 is a material film for the control gate CG. Subsequently, etching-back of the first polysilicon film 311 is performed. As a result, as shown in FIG. 29, the control, gate CG having a sidewall shape is formed on the first gate insulating film 310 in the trench 304. At this time, the control gate CG is so formed as to be located below the upper surface of the above-mentioned insulator structure (301a, 302a).

Figure 30:
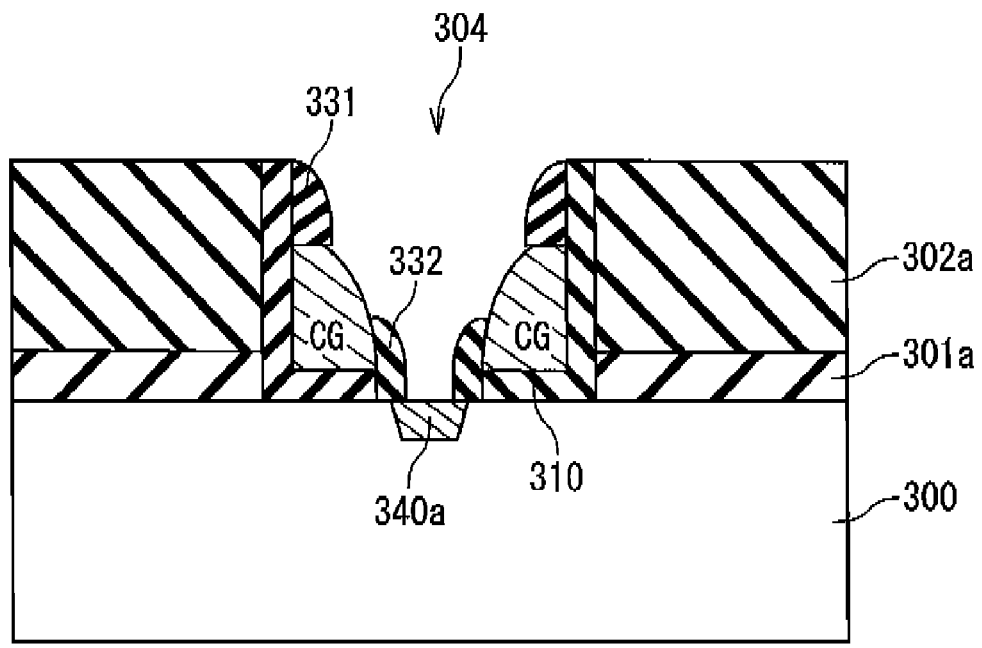
FIG. 30 is a sectional view showing the manufacturing process of the nonvolatile semiconductor memory according to the third exemplary embodiment.

Next, as shown in FIG. 30, unnecessary first gate insulating film 310 is removed by etching. As a result, the first gate insulating film 310 is changed to have an L shape surrounding the control gate CG. Subsequently, an insulating film is blanket deposited by the CVD method. The insulating film is an HTO film, for example. Further, a diffusion layer 340a is formed in the semiconductor substrate 300 lateral to the control gate CG by ion-implantation. Then, etching-back of the above-mentioned insulating film (HTO film) is performed. As a result, as shown in FIG. 30, sidewall insulators 331 and 332 are formed within the trench 304. The sidewall insulator 331 is formed on the control gate CG whose height is lower than the insulator structure (301a, 302a). On the other hand, the sidewall insulator 332 is formed between the control gate CG and the diffusion layer 340a and is in contact with the semiconductor substrate 300.

Figure 31:
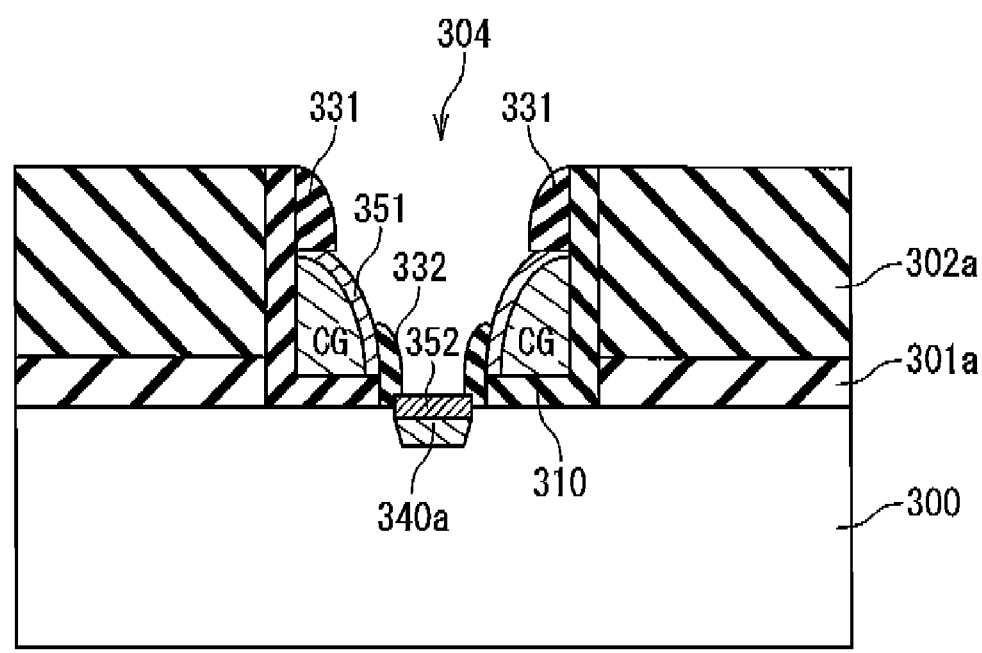
FIG. 31 is a sectional view showing the manufacturing process of the nonvolatile semiconductor memory according to the third exemplary embodiment.

Next, as shown in FIG. 31, respective upper surfaces of the control gate CG and the diffusion layer 340a are silicided simultaneously. For example, after a cobalt (Co) film is formed by sputtering, pre-sintering is performed. As a result, a cobalt silicide film 351 is formed on the upper surface of the control gate CG, and a cobalt silicide film 352 is formed on the upper surface of the diffusion layer 340a. Thereafter, excessive cobalt and silicide are removed by etching. According to the present exemplary embodiment, the sidewall insulator 332 is formed between the control gate CG and the diffusion layer 340a. Therefore, short-circuit between the silicide film 351 and the silicide film 352 is prevented at the silicidation process.

Figure 32:
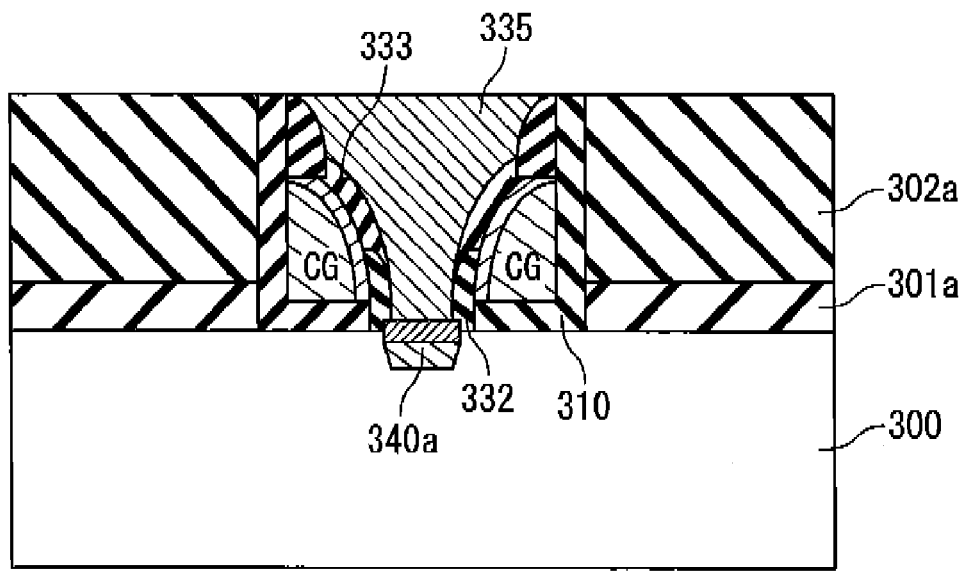
FIG. 32 is a sectional view showing the manufacturing process of the nonvolatile semiconductor memory according to the third exemplary embodiment.

Next, as shown in FIG. 32, after a protective insulating film 333 (for example, an HTO film) is blanket deposited, etching of the protective insulating film 333 is performed. The silicide film 351 on the control gate CG is covered with the protective insulating film 333. Subsequently, a plug 335 connecting to the silicide film 352 on the diffusion layer 340a is formed. The plug 335 is so formed as to fill the trench 304. For example, after a DOPOS film is blanket deposited by the CVD method, the DOPOS film is planarized by CMP. Thereby, the plug 335 composed of the DOPOS film filling the trench 304 is formed. The protective insulating film 333 is interposed between the plug 335 and the silicide film 351.

Figure 33:
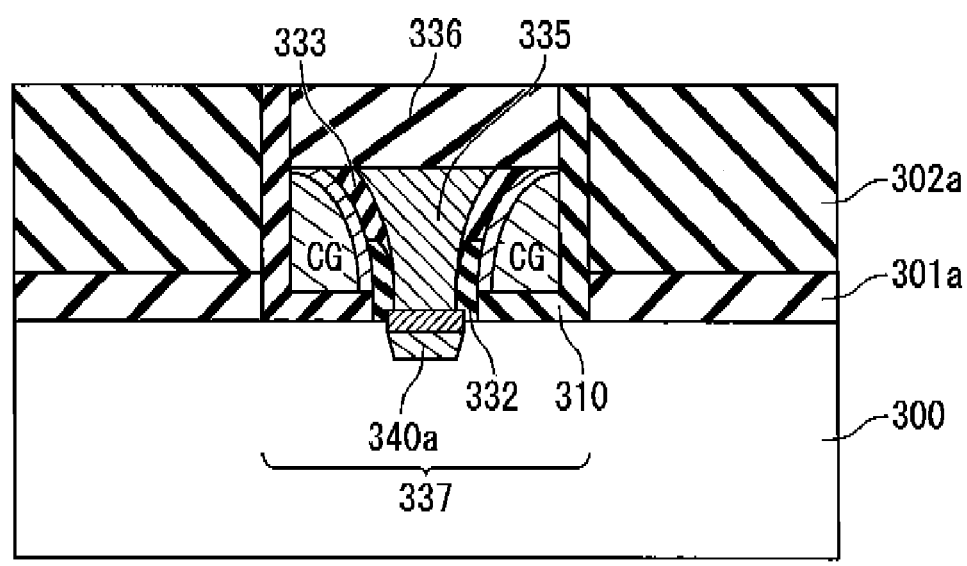
FIG. 33 is a sectional view showing the manufacturing process of the nonvolatile semiconductor memory according to the third exemplary embodiment.

Next, oxidation processing is performed. Thereby, an upper surface of the plug 335 (DOPOS film) is oxidized so that an insulating film ($SiO_2$ film) 336 is formed, as shown in FIG. 33. As a result, the upper surface of the plug 335 is located below the upper surface of the above-mentioned insulator structure (301a, 302a). At this time, the sidewall insulator 331 on the control gate CG merges with the insulating film 336. Thus, the insulator 336 is formed on the control gate CG and the plug 335.

As a result of the above-described processes, a structure that fills the trench 304 of the insulator structure (301a, 302a) is formed. The structure filling the trench 304 is hereinafter referred to as a "trench structure 337". The trench structure 337 includes the first gate insulating film 310, the control gate CG, the silicide film 351, the plug 335, the insulator 336 and the like.

Figure 34:
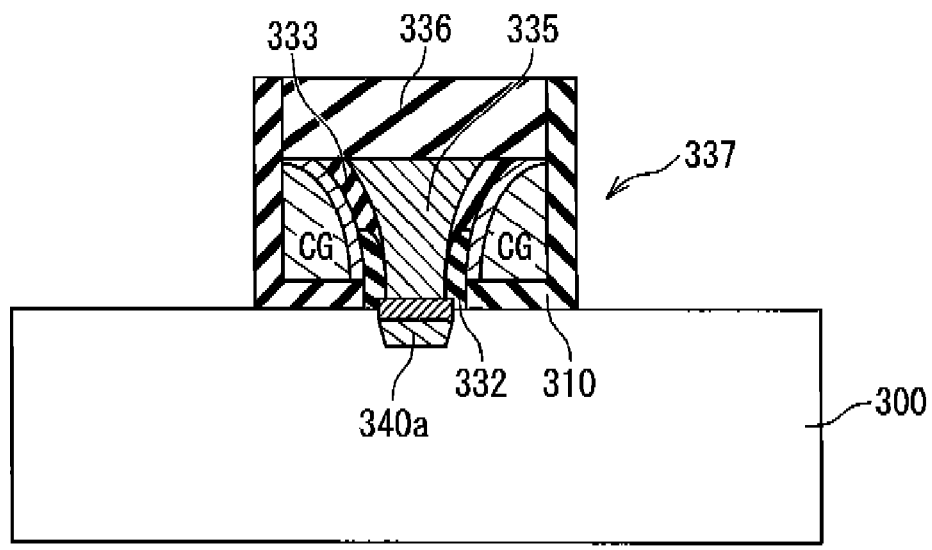
FIG. 34 is a sectional view showing the manufacturing process of the nonvolatile semiconductor memory according to the third exemplary embodiment.

Next, as shown in FIG. 34, the insulator structure 302a (SiN) is removed by wet-etching. Further, the insulator structure 301a ($SiO_2$) is removed by etching. As a result, the trench structure 337 remains on the semiconductor substrate 300.

Figure 35:
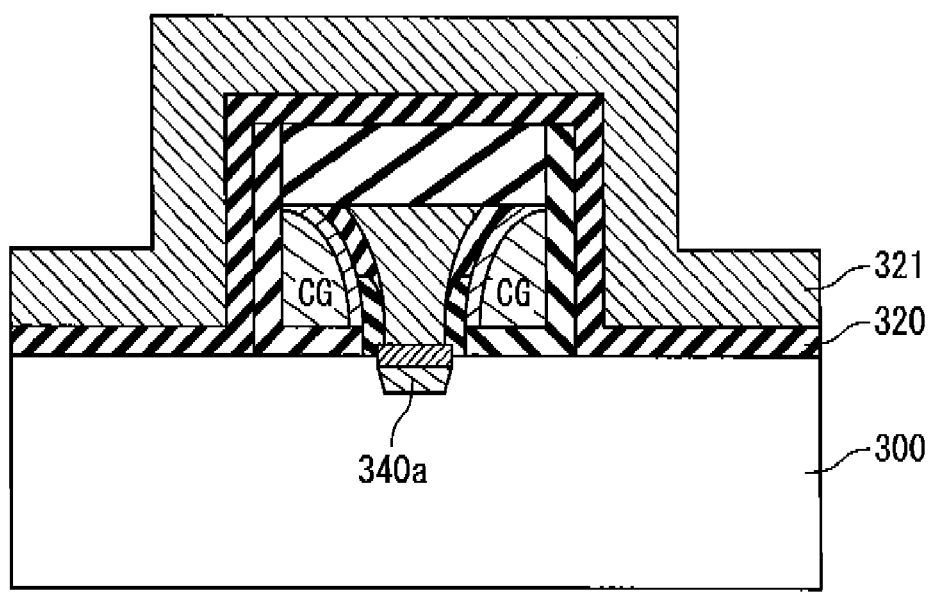
FIG. 35 is a sectional view showing the manufacturing process of the nonvolatile semiconductor memory according to the third exemplary embodiment.

Next, as shown in FIG. 35, a second gate insulating film 320 is blanket deposited by the CVD method. For example, the second gate insulating film 320 is an HTO film. Subsequently, a second polysilicon film (second gate material film) 321 is blanket deposited by the CVD method. The second polysilicon film 321 is a material film for the word gate WG.

Figure 36:
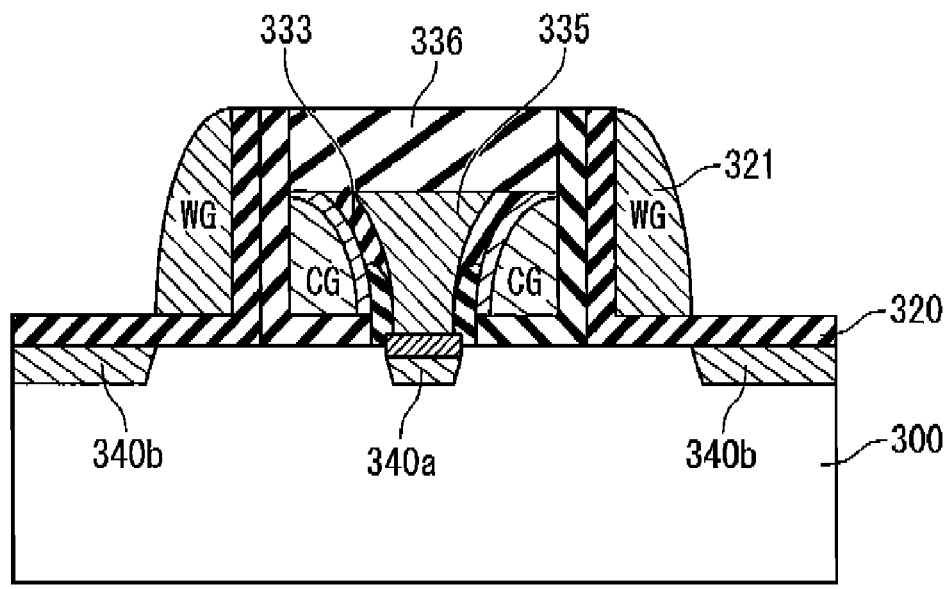
FIG. 36 is a sectional view showing the manufacturing process of the nonvolatile semiconductor memory according to the third exemplary embodiment.

Next, etching-back of the second polysilicon film 321 is performed. As a result, as shown in FIG. 36, the word gate WG having a sidewall shape is formed on the second gate insulating film 320 lateral to the trench structure 337. As shown in FIG. 36, the word gate WG is formed such that its, uppermost portion is located above the uppermost portion of the control gate CG. Thus, the control gate CG and the word gate WG facing each other across the first gate insulating film 310 and the second gate insulating film 320 are formed in a self-aligned manner by the etching-back technique. Both the control gate CG and the word gate WG have sidewall shapes (sidewall structures), and the curved surfaces thereof are oriented in opposite directions to each other.

Further, a diffusion layer 340b is formed in the semiconductor substrate 300 by ion-implantation. As shown in FIG.

36, the diffusion layer 340b is formed in the semiconductor substrate 300 lateral to the word gate WG.

Figure 37:
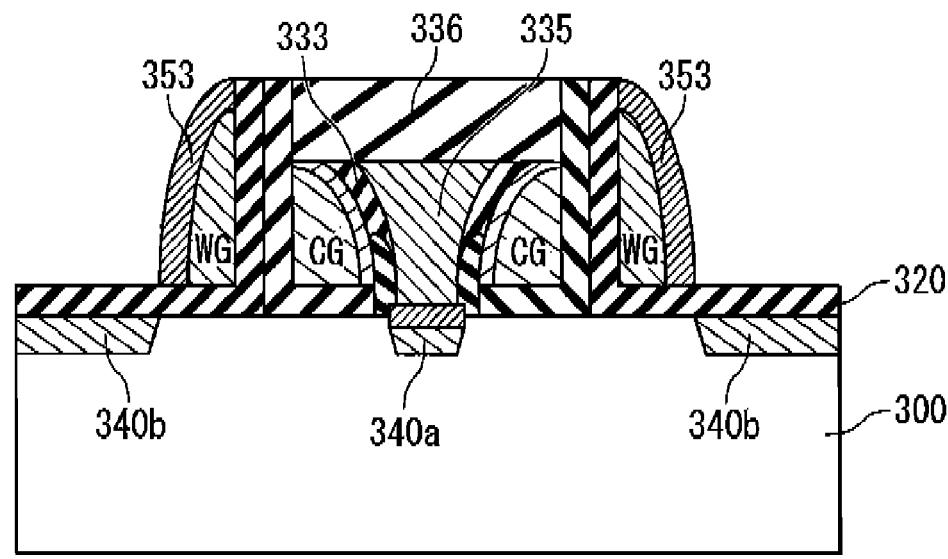
FIG. 37 is a sectional view showing the manufacturing process of the nonvolatile semiconductor memory according to the third exemplary embodiment.

Next, as shown in FIG. 37, the upper surface of the word gate WG is silicided. For example, after a cobalt (Co) film is formed by sputtering, pre-sintering is performed. As a result, a cobalt silicide film 353 is formed on the upper surface of the word gate WG. Thereafter, excessive cobalt and silicide are removed by etching. According to the present exemplary embodiment, the silicide film 351 on the control gate CG is embedded in the trench structure 337. Accordingly, short-circuit between the silicide film 351 and the silicide film 353 is prevented at the silicidation process.

Figure 38:
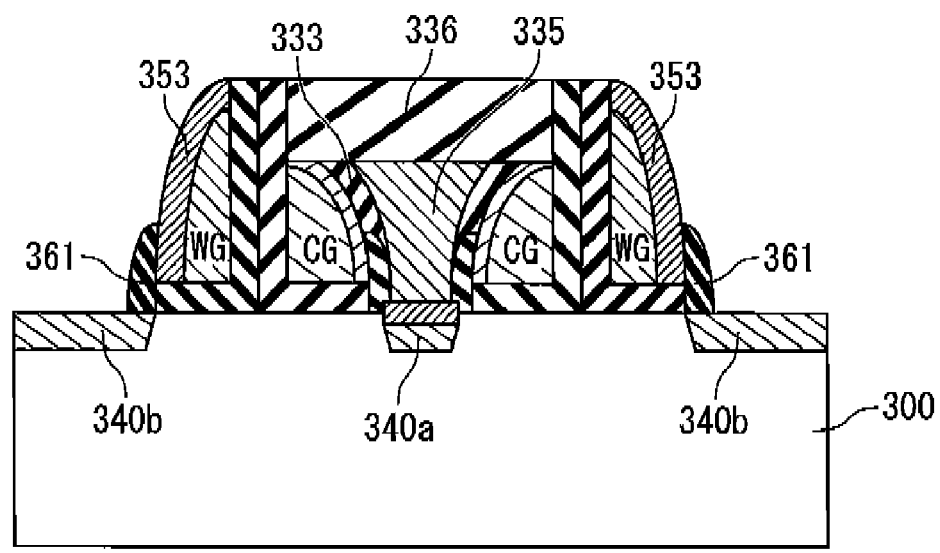
FIG. 38 is a sectional view showing the manufacturing process of the nonvolatile semiconductor memory according to the third exemplary embodiment.

Next, after an insulating film (for example, a $SiO_2$ film) is blanket deposited by the CVD method, etching-back of the insulating film is performed. As a result, as shown in FIG. 38, a sidewall insulator 361 is formed lateral to the silicide film 353. The sidewall insulator 361 is formed between the word gate WG and the diffusion layer 340b and is in contact with the semiconductor substrate 300. The second gate insulating film 320 on the diffusion layer 340b is also removed by this etching-back process.

Figure 39:
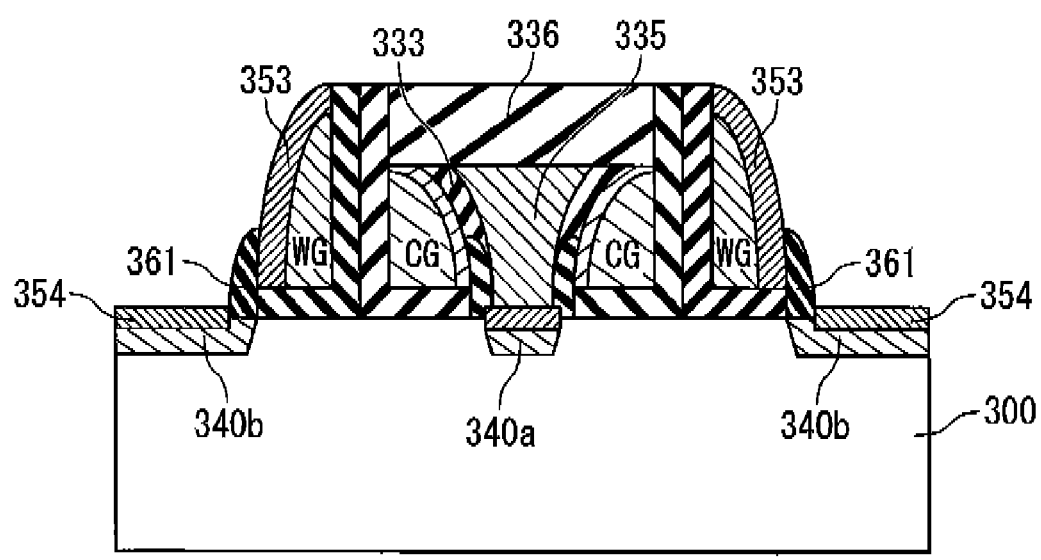
FIG. 39 is a sectional view showing the manufacturing process of the nonvolatile semiconductor memory according to the third exemplary embodiment.

Next, as shown in FIG. 39, the upper surface of the diffusion layer 340b is silicided. For example, after a cobalt (Co) film is formed by sputtering, pre-sintering is performed. As a result, a cobalt silicide film 354 is formed on the upper surface of the diffusion layer 340b. Thereafter, excessive cobalt and silicide are removed by etching. According to the present exemplary embodiment, the sidewall insulator 361 is formed between the word gate WG and the diffusion layer 340b. Accordingly, short-circuit between the silicide film 353 and the silicide film 354 is prevented at the silicidation process.

Thereafter, final sintering is performed under a higher temperature condition. As a result, final silicide films 351 to 354 are completed.

Figure 40:
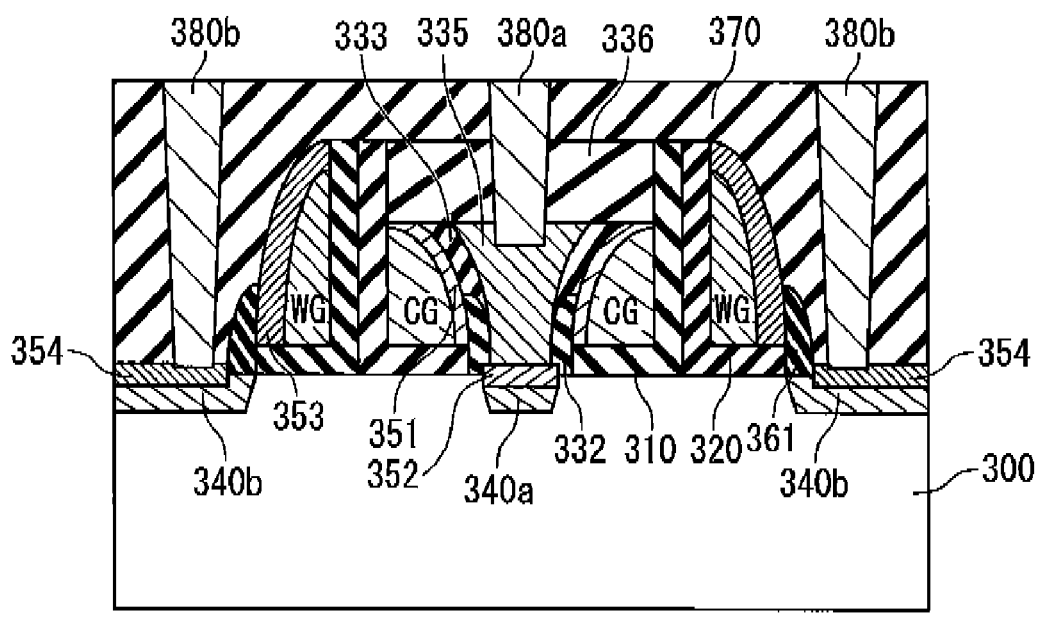
FIG. 40 is a sectional view showing the manufacturing process of the nonvolatile semiconductor memory according to the third exemplary embodiment.

Next, as shown in FIG. 40, an interlayer insulating film 370 is blanket deposited by the CVD method. Subsequently, the interlayer insulating film 370 is planarized by CMP. Further, contacts 380a and 380b penetrating through the interlayer insulating film 370 are formed by photolithography. The contact 380a is so formed as to penetrate through the interlayer insulating film 370 and the insulating film 336 to connect to the plug 335. The contact 380b is so formed as to connect to the silicide film 354 on the diffusion layer 340b. After that, word lines respectively connecting to the word gate WG and the control gate CG, bit lines respectively connecting to the contact 380a and the contact 380b, upper layer interconnections and the like are formed.

3-3. Effects

According to the present exemplary embodiment, the word gate WG and the control gate CG are formed in a self-aligned manner by the etching-back technique. Therefore, the area of the memory cell is reduced as compared with a case where the photolithography technique is used.

Moreover, according to the present exemplary embodiment, the upper surfaces of the control gate CG and the word gate WG are silicided. It, is therefore possible to rapidly raise the potentials of the control gate CG and the word gate WG up to the predetermined read potentials. That is, the data read speed is improved.

Furthermore, according to the present exemplary embodiment, the sidewall insulators 332 and 361 are formed near the word gate WG and the control gate CG. As a result, short-circuit between silicide films close to each other is prevented.

4. Fourth Exemplary Embodiment 4-1. Structure

Figure 41:
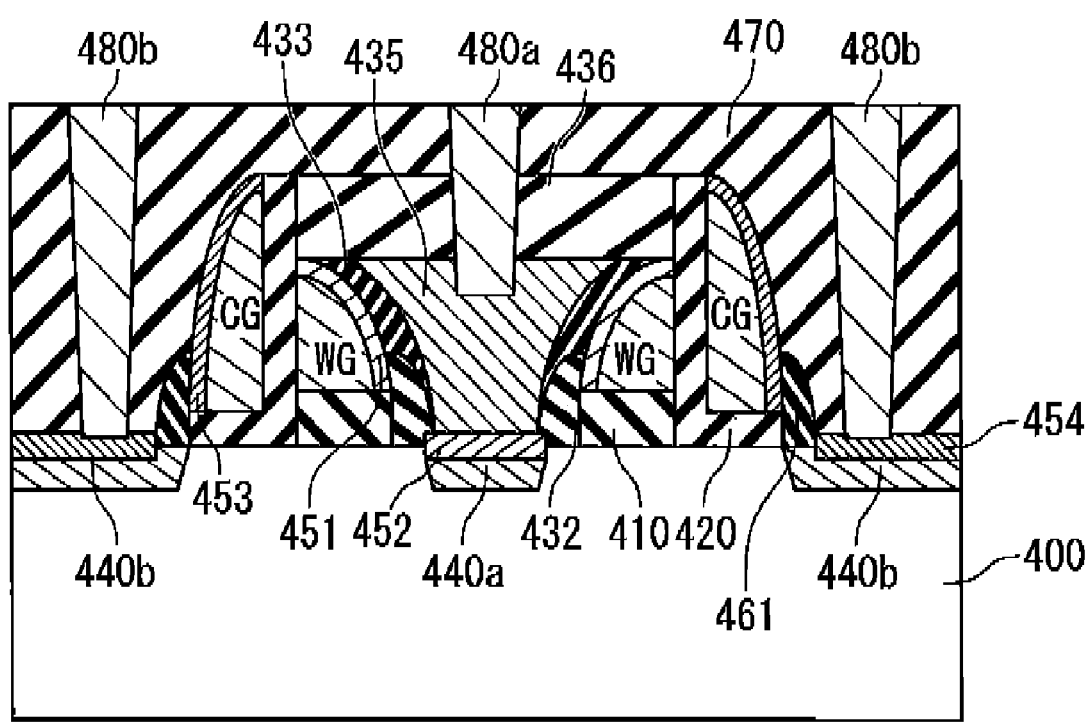
FIG. 41 is a sectional view showing a structure of a nonvolatile semiconductor memory according to a fourth exemplary embodiment of the present invention.

FIG. 41 is a sectional view showing a structural example of a nonvolatile semiconductor memory according to a fourth exemplary embodiment of the present invention. In a semiconductor, substrate 400, a diffusion layer 440a and a diffusion layer 440b serving as source/drain are formed. For example, the semiconductor substrate 400 is a P-type silicon substrate (P-type well), and the diffusion layer 440a and the diffusion layer 440b are N-type diffusion layers. A semiconductor region between the diffusion layer 440a and the diffusion layer 440b is a channel region.

A word gate WG is formed on a part of a channel region through a first gate insulating film 410. A control gate CG is formed on another part of the channel region through a second gate insulating film 420. That is, the word gate WG and the control gate CG are arranged side by side on the channel region and they face each other across an insulating film. In the example shown in FIG. 41, the insulating film interposed between the word gate WG and the control gate CG is a part of the second gate insulating film 420. That is, the second gate insulating film 420 extends from between the control gate CG and the semiconductor substrate 400 to between the control gate CG and the word gate WG.

Moreover, both the word gate WG and the control gate CG have sidewall shapes (sidewall structures). As described later, this results from a fact that the word gate WE and the control gate CG are formed by the etch-back technique. In the example shown in FIG. 41, an upper surface of the word gate WG is curved and comes down (comes closer to the semiconductor substrate 400) as away from the control gate CG. Similarly, an upper surface of the control gate CG also is curved and comes down as away from the word gate WG. That is, respective curved surfaces of the word gate WG and the control gate CG having the sidewall shapes are oriented in opposite directions to each other. In the example shown in FIG. 41, the uppermost portion of the word gate WE is located below the uppermost portion of the control gate CG.

In the present exemplary embodiment, respective upper surfaces of the word gate WG, the control gate CG, the diffusion layer 440a and the diffusion layer 440b are silicided. Specifically, a silicide film 451 is formed on the upper surface of the word gate WG, and a silicide film 453 is formed on the upper surface of the control gate CG. For example, the word gate WG and the control gate CG are made of polysilicon, and the silicide films 451 and 453 are cobalt silicide (CoSi) films. Further, a silicide film 452 is formed on the diffusion layer 440a and a silicide film 454 is formed on the diffusion layer 440b. For example, the silicide films 452 and 454 are cobalt silicide films.

Furthermore, an insulator 432 is formed between the silicide film 451 on the word gate WG and the silicide film 452 on the diffusion layer 440a. Furthermore, an insulator 461 is formed between the silicide film 453 on the control gate CG and the silicide film 454 on the diffusion layer 440b. In the example shown in FIG. 41, each of the insulator 432 and the insulator 461 has a sidewall shape (sidewall structure), and it is hereinafter referred to as a "sidewall insulator". The sidewall insulators 432 and 461 are so formed as to be in contact with the semiconductor substrate 400. As described later, the sidewall insulator 432 is effective for preventing short-circuit between the silicide film 451 and the silicide film 452, and the sidewall insulator 461 is effective for preventing short-circuit between the silicide film 453 and the silicide film 454.

A protective insulating film 433 is so formed as to cover the silicide film 451. A plug 435 is formed on the silicide film 452 and the protective insulating film 433. That is, the protective insulating film 433 is interposed between the silicide film 451 and the plug 435. The plug 435 is a DODOS film, for example. An upper surface of the plug 435 is located below the uppermost portion of the control gate CG. An insulating film 436 is formed on the plug 435.

Furthermore, an interlayer insulating film 470 is formed to cover the whole. A contract 480a is so formed as to penetrate through the interlayer insulating film 470 and the insulating film 436 to connect to the plug 435. That is, the contact 480a is electrically connected to the silicide film 452 on the diffusion layer 440a. A contact 480b is so formed as to penetrate through the interlayer insulating film 470 to electrically connect to the silicide film 454 on the diffusion layer 440b. The contact 480a and the contact 480b are connected to bit lines.

In the present exemplary embodiment, the second gate, insulating film 420 on the side of the control gate CG is a charge trapping film which traps charges. For example, the second gate insulating film 420 is an ONO film formed by laminating a silicon oxide film, a silicon nitride film and a silicon oxide film in this order. In this case, the control gate CG serves as a gate electrode of a MONOS transistor. In a case where charges are trapped in the ONO film, the threshold voltage of the MONOS transistor is increased as compared with a case where charges are not trapped in the ONO film. By utilizing such change in the threshold voltage, the memory cell according to the present exemplary embodiment can non-volatilely store data "1" and "0". In FIG. 41, memory cells corresponding to two bits are shown.

Electron injection into the ONO film is achieved by the CHE method. When appropriate potentials are respectively applied to the semiconductor substrate 400, the control gate CG, the word gate WG, the diffusion layer 440a and the diffusion layer 440b, electrons move from the diffusion layer 440a (the source) toward the diffusion layer 440b (the drain). Electrons in the channel region are accelerated by intense electric field between the control gate CG and the word gate WG and intense electric field near the drain to be channel hot electrons. Some of the generated channel hot electrons are injected into the ONO film below the control gate CG. As a result, the threshold voltage of the MONOS transistor is increased.

In order to lower the threshold voltage, electrons are drawn out from the ONO film or holes are injected into the ONO film. In the present exemplary embodiment, for example, holes are injected into the ONO film (HHI: Hot Hole Injection method). In this case, a negative potential is applied to the control gate CG and a positive potential is applied to the diffusion layer 440b, so that intense electric field is generated between the control gate CG and the diffusion layer 440b. When the intense electric field is applied to a depletion layer around an edge portion of the diffusion layer 440b, the band-to-band tunnel phenomenon is generated in the depletion layer. Due to the band-to-band tunnel phenomenon, electron-hole pairs are generated in the depletion layer where no carriers originally exist. Electrons of the electron-hole pairs are attracted toward the diffusion layer 440b. On the other hand, holes of the electron-hole pairs are attracted toward the channel region by a depletion layer electric field. At this time, the holes are accelerated by the depletion layer electric field to be hot holes. The hot holes having high energy are attracted to the negative potential of the control gate CG to be injected into the ONO film below the control gate CG. As a result, the threshold voltage of the MONOS transistor is decreased.

At the time of data reading from the memory cell, appropriate read potentials are respectively applied to the semiconductor substrate 400, the word gate WG, the control gate CG, the diffusion layer 440a and the diffusion layer 440b. In a case where the threshold voltage is high, the MONOS transistor remains at the OFF state and the channel is non-conductive. On the other hand, in a case where the threshold voltage is low, the MONOS transistor is turned ON, and electrons move from the diffusion layer 440b (the source) toward the diffusion layer 440a (the drain). Therefore, the data stored in the memory cell can be determined based upon magnitude of a read current flowing through a bit line connecting to the source or the drain. Since the upper surfaces of the control gate CG and the word gate WO are silicided, the data read speed is improved.

4-2. Manufacturing Method

Next, a manufacturing method of the nonvolatile semiconductor memory according to the present exemplary embodiment will be described. FIGS. 42 to 56 are sectional views showing an example of manufacturing processes of the structure shown in FIG. 41.

Figure 42:
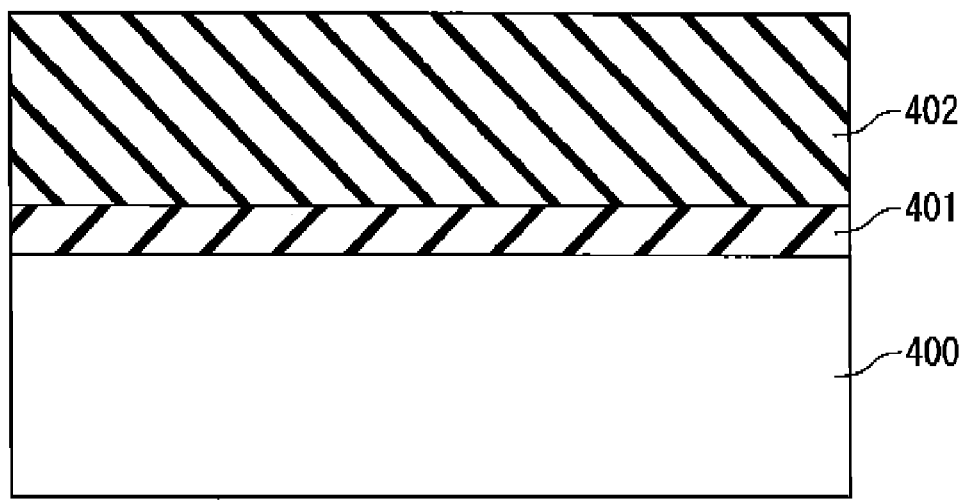
FIG. 42 is a sectional view showing a manufacturing process of the nonvolatile semiconductor memory according to the fourth exemplary embodiment.

As shown in FIG. 42, first, an insulating film 401 is formed on a semiconductor substrate 400. For example, the semiconductor substrate 400 is a P-type silicon substrate (P-type well), and the insulating film 401 is a $SiO_2$ film formed by thermal oxidation method. Further, an insulating film 402 is formed on the insulating film 401. For example, the insulating film 402 is a SiN film formed by the CVD method.

Figure 43:
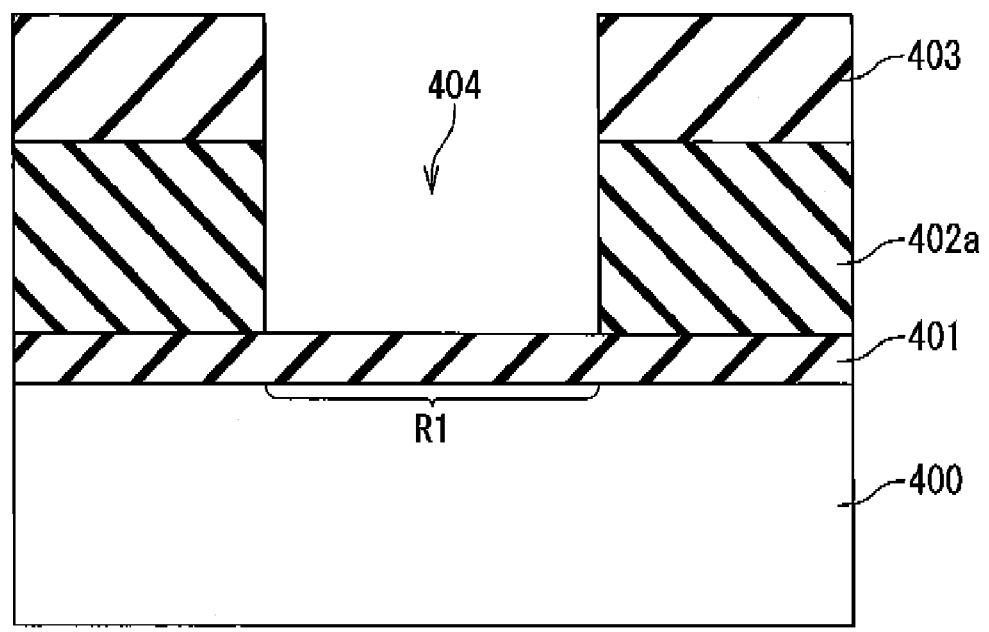
FIG. 43 is a sectional view showing the manufacturing process of the nonvolatile semiconductor memory according to the fourth exemplary embodiment.
Figure 44:
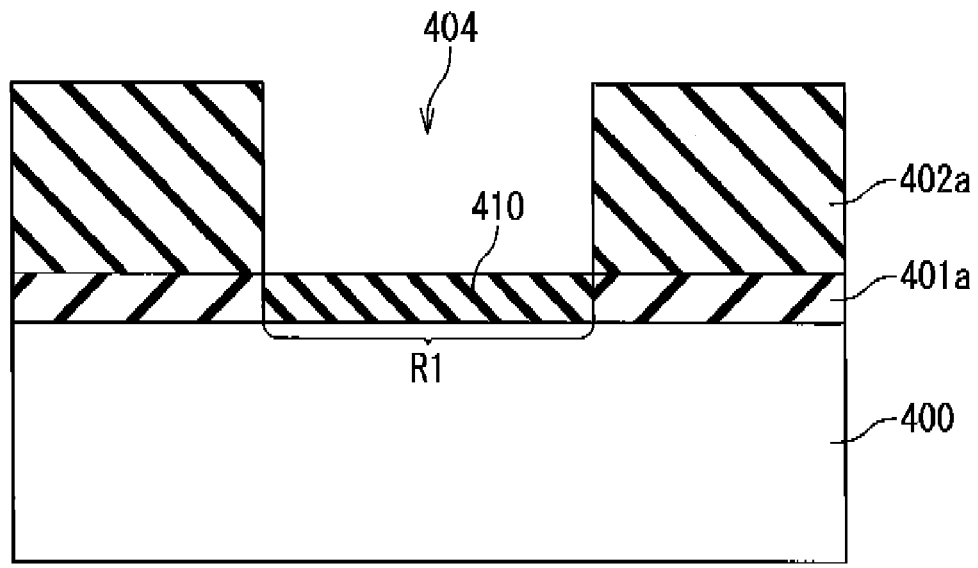
FIG. 44 is a sectional view showing the manufacturing process of the nonvolatile semiconductor memory according to the fourth exemplary embodiment.

Next, as shown in FIG. 43, a photoresist 403 having an opening portion in a region R1 is formed on the insulating film 402. The insulating film 402 is etched by using the photoresist 403. As a result, an insulator structure 402a having a trench 404 in the region R1 is formed. Thereafter, the photoresist 403 is removed. Further, the insulating film 401 in the region R1 is removed by wet-etching using the insulator structure 402a as a mask. As a result, as shown in FIG. 44, an insulator structure (401a, 402a) is formed on the semiconductor substrate 400. The insulator structure (401a, 402a) has a trench 404 reaching the semiconductor substrate 400 in the region R1.

Next, as shown in FIG. 44, a first gate insulating film 410 is formed on the semiconductor substrate 400 in the trench 404. For example, the first gate insulating film 410 is a $SiO_2$ film formed by thermal oxidation method.

Figure 45:
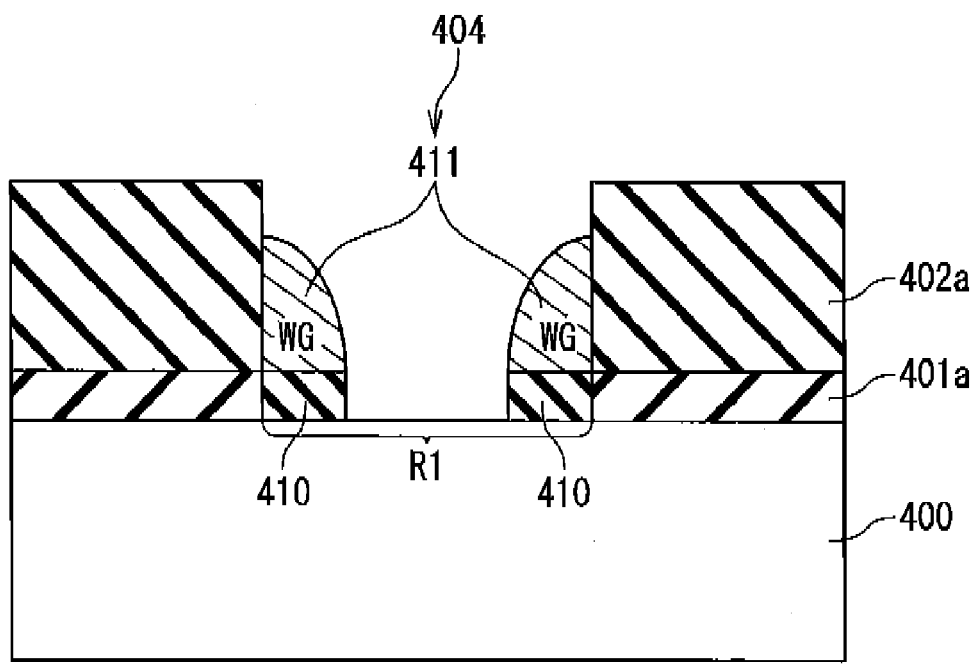
FIG. 45 is a sectional view showing the manufacturing process of the nonvolatile semiconductor memory according to the fourth exemplary embodiment.

Next, a first polysilicon film (first gate material film) 411 is blanket deposited by the CVD method. The first polysilicon film 411 is a material film for the word gate WG. Subsequently, etching-back of the first polysilicon film 411 is performed. As a result, as shown in FIG. 45, the word gate WG having a sidewall shape is formed on the first gate insulating film 410 in the trench 404. At this time, the word gate WG is so formed as to be located below the upper surface of the above-mentioned insulator structure (401a, 402a).

Figure 46:
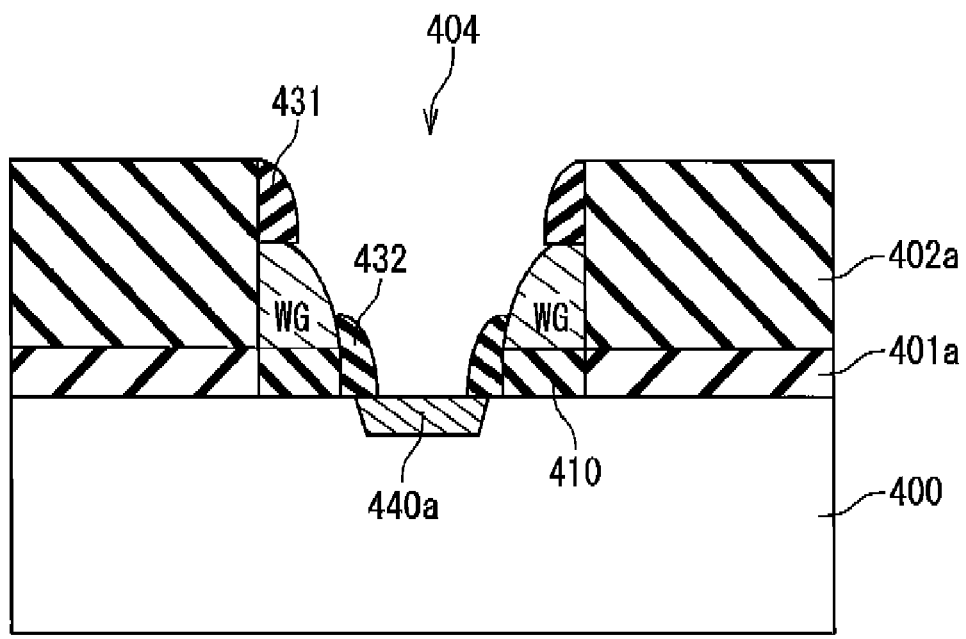
FIG. 46 is a sectional view showing the manufacturing process of the nonvolatile semiconductor memory according to the fourth exemplary embodiment.

Next, an insulating film is blanket deposited by the CVD method. The insulating film is an HTO film, for example. Further, a diffusion layer 440a is formed in the semiconductor substrate 400 lateral to the word gate WG by ion implantation. Etching-back of the above-mentioned insulating film (HTO film) is performed. As a result, as shown in FIG. 46, sidewall insulators 431 and 432 are formed within the trench 404. The sidewall insulator 431 is formed on the word gate WG whose height is lower than the insulator structure (401a, 402a). On the other hand, the sidewall insulator 432 is formed between the word gate WG and the diffusion layer 440a and is in contact with the semiconductor substrate 400.

Figure 47:
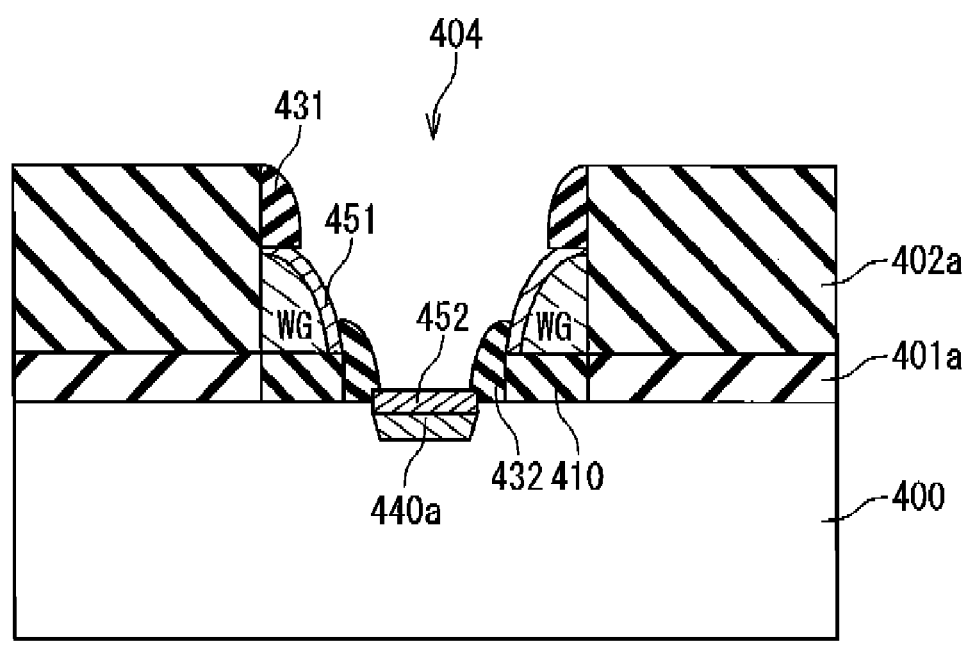
FIG. 47 is a sectional view showing the manufacturing process of the nonvolatile semiconductor memory according to the fourth exemplary embodiment.

Next, as shown in FIG. 47, respective upper surfaces of the word gate WG and the diffusion layer 440a are silicided simultaneously. For example, after a cobalt (Go) film is formed by sputtering, pre-sintering is performed. As a result, a cobalt silicide film 451 is formed on the upper surface of the word gate WG, and a cobalt silicide film 452 is formed on the upper surface of the diffusion layer 440a. Thereafter, excessive cobalt and silicide are removed by etching. According to the present exemplary embodiment, the sidewall insulator 432 is formed between the word gate WG and the diffusion layer 440a. Therefore, short-circuit between the silicide film 451 and the silicide film 452 is prevented at the silicidation process.

Figure 48:
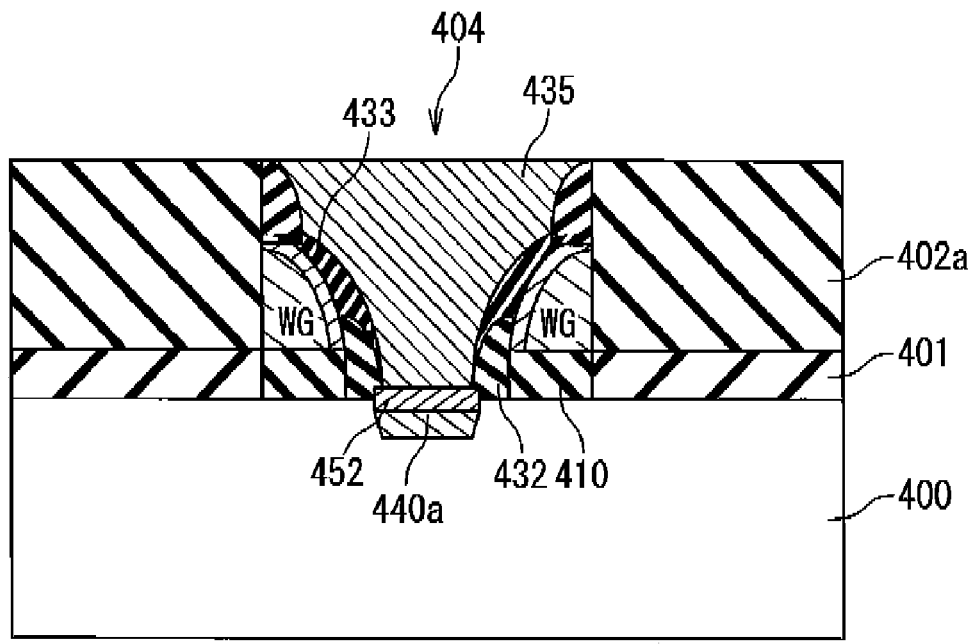
FIG. 48 is a sectional view showing the manufacturing process of the nonvolatile semiconductor memory according to the fourth exemplary embodiment.

Next, as shown in FIG. 48, after a protective insulating film 433 (for example, an HTO film) is blanket deposited, etching-back of the protective insulating film 433 is performed. The silicide film 451 on the word gate WG is covered with the protective insulating film 433. Subsequently, a plug 435 connecting to the silicide film 452 on the diffusion layer 440a is formed. The plug 435 is so formed as to fill the trench 404. For example, after a DOPOS film is blanket deposited by the CVD method, the DOPOS film is planarized by CMP. Thereby, the plug 435 composed of the DOPOS film filling the trench 404 is formed. The protective insulating film 433 is interposed between the plug 435 and the silicide film 451.

Figure 49:
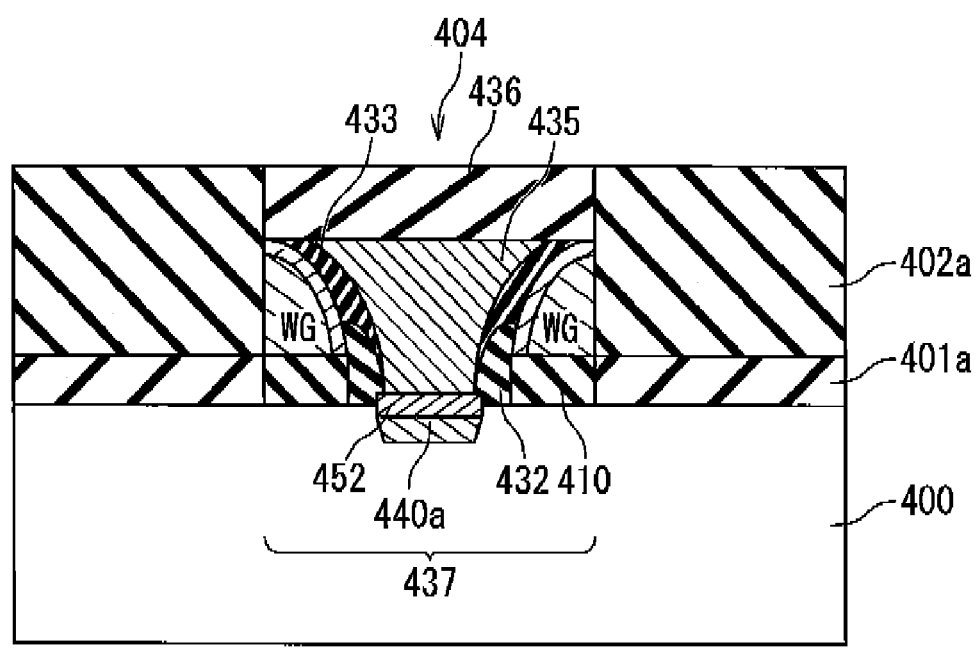
FIG. 49 is a sectional view showing the manufacturing process of the nonvolatile semiconductor memory according to the fourth exemplary embodiment.

Next, oxidation processing is performed. Thereby, an upper surface of the plug 435 (DOPOS film) is oxidized, so that an insulating film ($SiO_2$ film) 436 is formed, as shown in FIG. 49. As a result, the upper surface of the plug 435 is located below the upper surface of the above-mentioned insulator structure (401a, 402a). At this time, the sidewall insulator 431 on the word gate WG merges with the insulating film 436. Thus, the insulator 436 is formed on the word gate WG and the plug 435.

As a result of the above-described processes, a structure that fills the trench 404 of the insulator structure (401a, 402a) is formed. The structure filling the trench 404 is hereinafter referred to as a "trench structure 437". The trench structure 437 includes the first gate insulating film 410, the word gate WG, the silicide film 451, the plug 435, the insulator 436 and the like.

Figure 50:
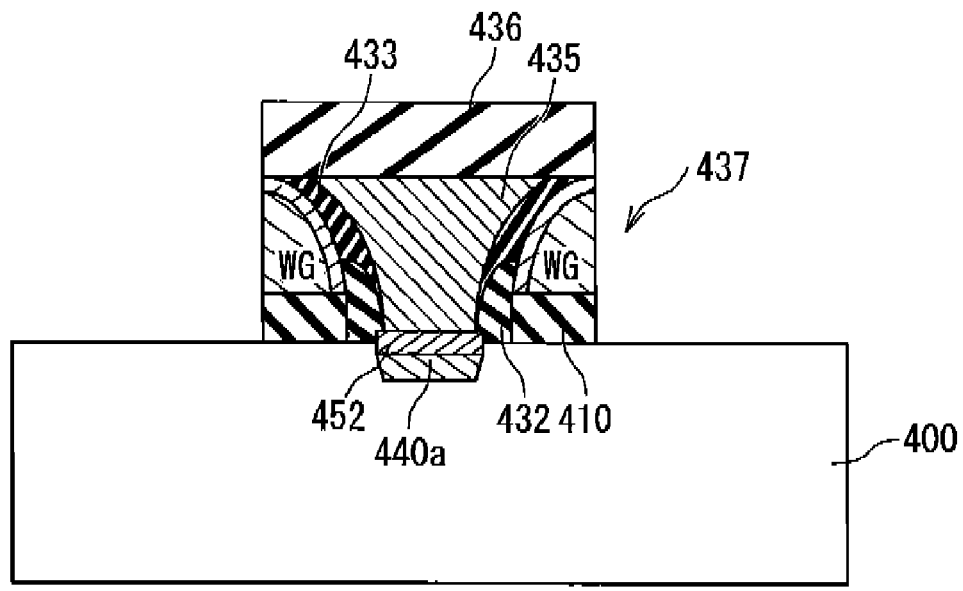
FIG. 50 is a sectional view showing the manufacturing process of the nonvolatile semiconductor memory according to the fourth exemplary embodiment.

Next, as shown in FIG. 50, the insulator structure 402a (SiN) is removed by wet-etching. Further, the insulator structure 401a ($SiO_2$) is removed by etching. As a result, the above-mentioned trench structure 437 remains on the semiconductor substrate 400.

Figure 51:
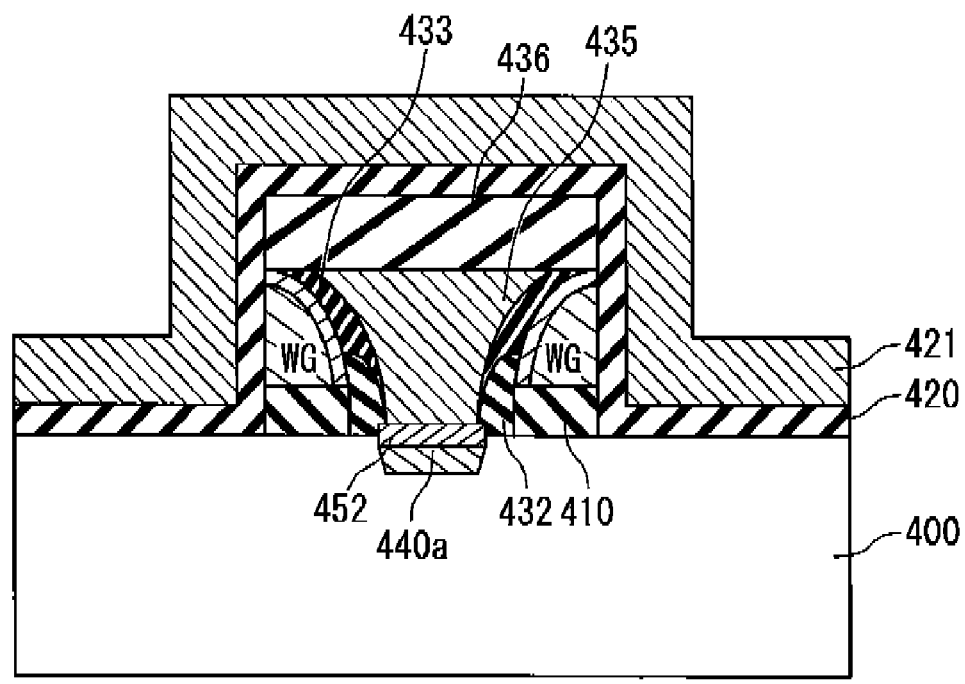
FIG. 51 is a sectional view showing the manufacturing process of the nonvolatile semiconductor memory according to the fourth exemplary embodiment.

Next, as shown in FIG. 51, a second gate insulating film 420 which is a charge trapping film is blanket formed. For example, the second gate insulating film 420 is an ONO film, and it is formed by laminating a silicon oxide film, a silicon nitride film and a silicon oxide film in this order by the CVD method. Subsequently, a second polysilicon film (second gate material film) 421 is blanket deposited by the CVD method. The second polysilicon film 421 is a material film for the control gate CG.

Figure 52:
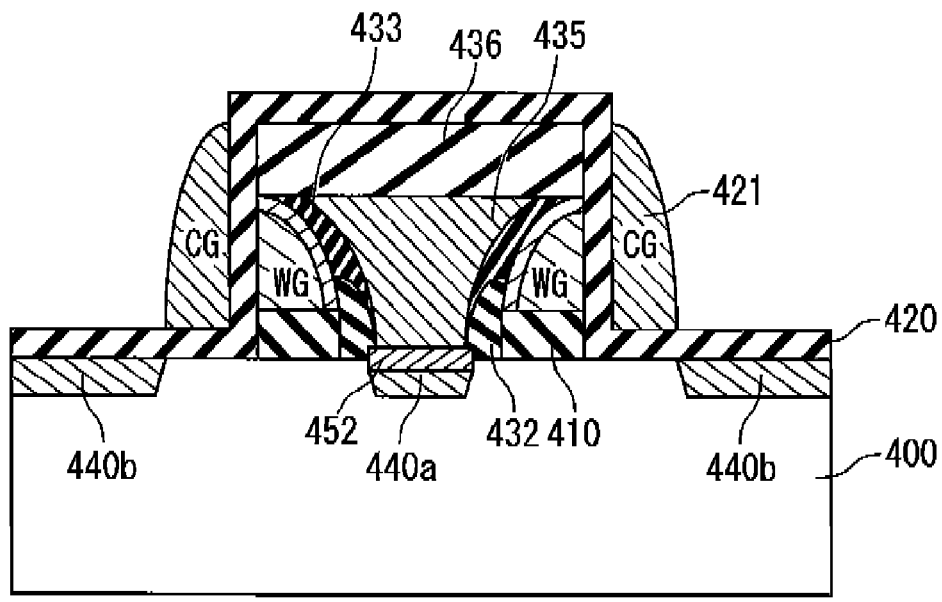
FIG. 52 is a sectional view showing the manufacturing process of the nonvolatile semiconductor memory according to the fourth exemplary embodiment.

Next, etching-back of the second polysilicon film 421 is performed. As a result, as shown in FIG. 52, the control gate CG having a sidewall shape is formed on the second gate insulating film 420 lateral to the trench structure 437. As shown in FIG. 52, the control gate CG is formed such that its uppermost portion is located above the uppermost portion of the word gate WG. Thus, the word gate WG and the control gate CG facing each other across the second gate insulating film 420 are formed in a self-aligned manner by the etching-back technique. Both the word gate WG and the control gate CG have sidewall shapes (sidewall structures), and the curved surfaces thereof are oriented in opposite directions to each other.

Further, a diffusion layer 440b is formed in the semiconductor substrate 400 by ion implantation. As shown in FIG. 52, the diffusion layer 440b is formed in the semiconductor substrate 400 lateral to the control gate CG.

Figure 53:
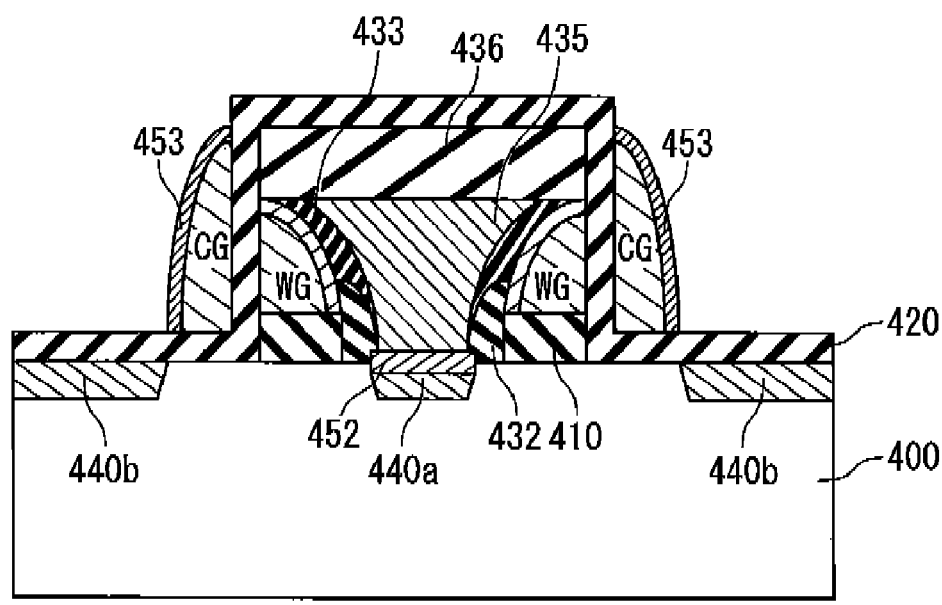
FIG. 53 is a sectional view showing the manufacturing process of the nonvolatile semiconductor memory according to the fourth exemplary embodiment.

Next, as shown in FIG. 53, the upper surface of the control gate CG is silicided. For example, after a cobalt (Co) film is formed by sputtering, pre-sintering is performed. As a result, a cobalt silicide film 453 is formed on the upper surface of the control gate CG. Thereafter, excessive cobalt and silicide are removed by etching. According to the present exemplary embodiment, the silicide film 451 on the word gate WG is embedded in the trench structure 437. Accordingly, short-circuit between the silicide film 451 and the silicide film 453 is prevented at the silicidation process.

Figure 54:
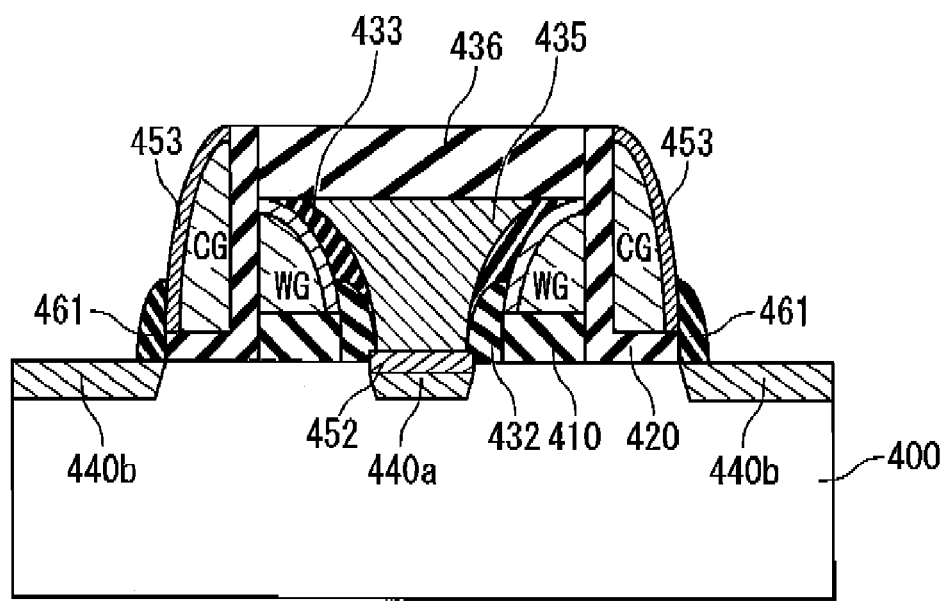
FIG. 54 is a sectional view showing the manufacturing process of the nonvolatile semiconductor memory according to the fourth exemplary embodiment.

Next, as shown in FIG. 54, unnecessary second gate insulating film 420 is removed by etching. As a result, the second gate insulating film 310 is changed to have an L shape surrounding the control gate CG. Subsequently, after an insulating film (for example, a $SiO_2$ film) is blanket deposited by the CVD method, etching-back of the insulating film is performed. As a result, as shown in FIG. 54, a sidewall insulator 461 is formed lateral to the silicide film 453. The sidewall insulator 461 is formed between the control gate CG and the diffusion layer 440b and is in contact with the semiconductor substrate 400.

Figure 55:
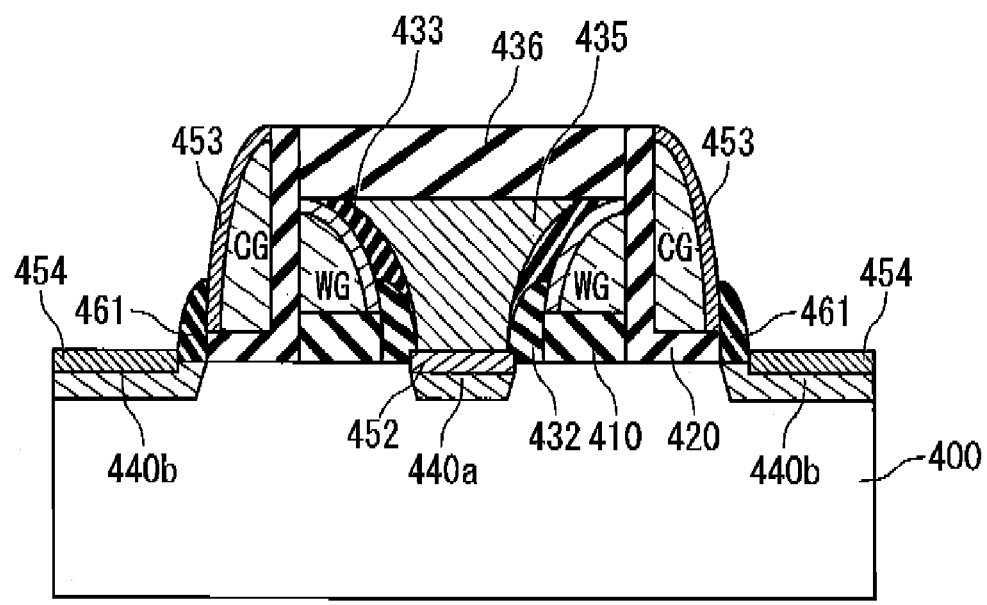
FIG. 55 is a sectional view showing the manufacturing process of the nonvolatile semiconductor memory according to the fourth exemplary embodiment.

Next, a shown in FIG. 55, the upper surface of, the diffusion layer 440b is silicided. For example, after a cobalt (Co) film is formed by sputtering, pre-sintering is performed. As a result, a cobalt silicide film 454 is formed on the upper surface of the diffusion layer 440h. Thereafter, excessive cobalt and silicide are removed by etching. According to the present exemplary embodiment, the sidewall insulator 461 is formed between the control gate CG and the diffusion layer 440b. Accordingly, short-circuit between the silicide film 453 and the silicide film 454 is prevented at the silicidation process.

Thereafter, final sintering is performed under a higher temperature condition. As a result, final silicide films 451 to 454 are completed.

Figure 56:
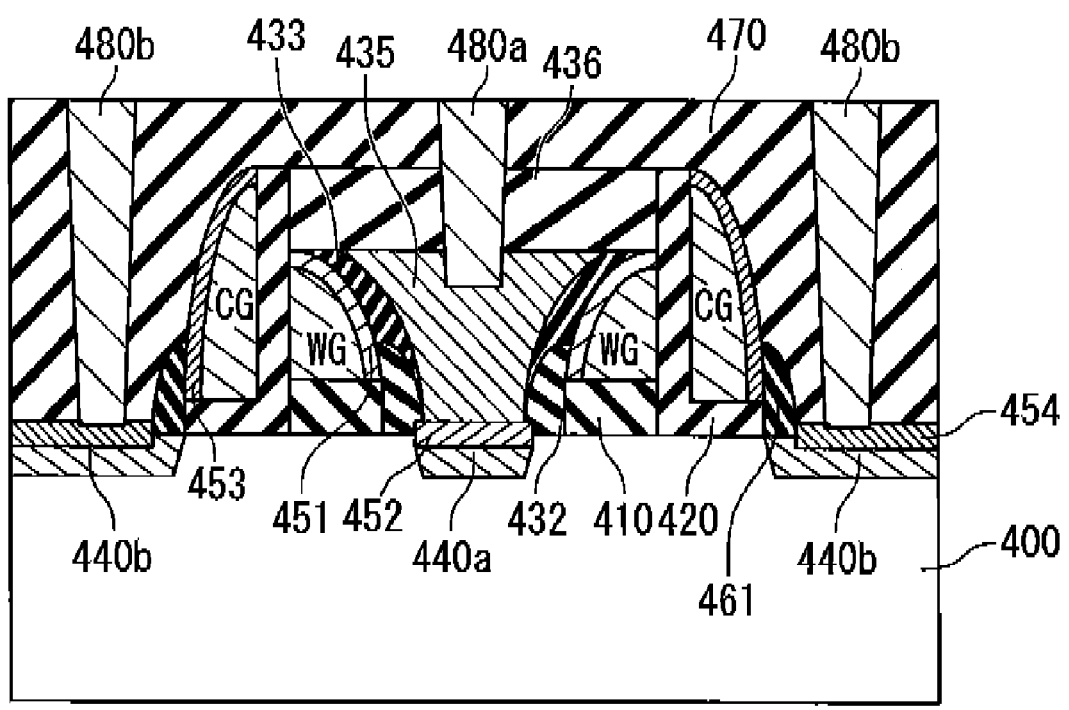
FIG. 56 is a sectional view showing the manufacturing process of the nonvolatile semiconductor memory according to the fourth exemplary embodiment.

Next, as shown in FIG. 56, an interlayer insulating film 470 is blanket deposited by the CVD method. Subsequently, the interlayer insulating film 470 is planarized by CMP. Further, contacts 480a and 480b penetrating through the interlayer insulating film 470 are formed by photolithography. The contact 480a is so formed as to penetrate through the interlayer insulating film 470 and the insulating film 436 to connect to the plug 435. The contact 480h is so formed as to connect to the silicide film 454 on the diffusion layer 440b. After that, word lines respectively connecting to the word gate WG and the control gate CG, bit lines respectively connecting to the contact 480a and the contact 480b, upper layer interconnections and the like are formed.

4-3. Effects

According to the present exemplary embodiment, the word gate WG and the control gate CG are formed in a self-aligned manner by the etching-back technique. Therefore, the area of the memory cell is reduced as compared with a case where the photolithography technique is used.

Moreover, according to the present exemplary embodiment, the upper surfaces of the control gate CG and the word gate WG are silicided. It is therefore possible to rapidly raise the potentials of the control gate CG and the word gate WG up to the predetermined read potentials. That is, the data read speed is improved.

Furthermore, according to the present exemplary embodiment, the sidewall insulators 432 and 461 are formed near the word gate WG and the control gate CG. As a result, short-circuit between silicide films close to each other is prevented.

It is apparent that the present invention is not limited to the above exemplary embodiments and may be modified and changed without departing from the scope and spirit of the invention.

5. Supplementary Note

The whole or part of the exemplary embodiments disclosed above can be described as, but not limited to, the following supplementary notes.

(#1) A nonvolatile semiconductor memory comprising:
a semiconductor substrate in which a first diffusion layer and a second diffusion layer are formed;
a first gate electrode having a sidewall shape and formed on a channel region between said first diffusion layer and said second diffusion layer through a first gate insulating film;
a second gate electrode having a sidewall shape and formed on said channel region through a second gate insulating film;
a first silicide film formed on an upper surface of said first gate electrode; and
a second silicide film formed on an upper surface of said second gate electrode,
wherein said first gate electrode and said second gate electrode are arranged side by side on said channel region, and an insulating film is interposed between said first gate electrode and said second gate electrode, and
wherein any one of said first gate insulating film and said second gate insulating film is a charge trapping film that traps charges.

(#2) The nonvolatile semiconductor memory according to (#1), further comprising a first insulator formed between said first silicide film and said second silicide film,
wherein said first insulator is different from said insulating film interposed between said first gate electrode and said second gate electrode.

(#3) The nonvolatile semiconductor memory according to (#2),
wherein said first insulator has a sidewall shape.

(#4) The nonvolatile semiconductor memory according to (#2),
wherein an uppermost portion of said second gate electrode is located below an uppermost portion of said first gate electrode, and
said first insulator is formed on said second gate electrode.

(#5) The nonvolatile semiconductor memory according to (#1), further comprising:
a third silicide film formed on said first diffusion layer; and
a fourth silicide film formed on said second diffusion layer.

(#6) The nonvolatile semiconductor memory according to (#5), further comprising:
a second insulator formed between said second silicide film and said third silicide film; and
a third insulator formed between said first silicide film and said fourth silicide film,
wherein said second insulator and said third insulator each has a sidewall shape.

(#7) The nonvolatile semiconductor memory according to (#6),
wherein said second insulator and said third insulator are in contact with said semiconductor substrate.

What is claimed is:

1. A method of manufacturing a nonvolatile semiconductor memory, comprising:
forming an insulator structure on a semiconductor substrate in a first region;
forming a first gate insulating film on said semiconductor substrate outside said first region;
blanket depositing a first gate material film and etching-back said first gate material film to form a first gate electrode on said first gate insulating film lateral to said insulator structure;
removing said insulator structure;
blanket forming a second gate insulating film;
blanket depositing a second gate material film and etching-back said second gate material film to form a second gate electrode on said second gate insulating film in said first region; and
silicidation of upper surfaces of said first gate electrode and said second gate electrode,
wherein any one of said first gate insulating film and said second gate insulating film is a charge trapping film that traps charges, and at least one of said upper surfaces of said first and second gate electrodes is convex curved.

2. The method according to claim 1, wherein said second gate electrode is formed such that an uppermost portion of said second gate electrode is located below an uppermost portion of said first gate electrode.

3. The method according to claim 1, further comprising: blanket depositing an insulating film and etching-back said insulating film to form a cover layer over the upper part region of the second gate electrode, after the formation of said second gate electrode and before said silicidation.

4. The method according to claim 3, further comprising: forming a first diffusion layer and a second diffusion layer in said semiconductor substrate, before said silicidation, wherein in said silicidation, upper surfaces of said first gate electrode and said second gate electrode, said first diffusion layer, and said second diffusion layer are silicided simultaneously.

5. The method according to claim 1, wherein the curved upper surfaces of said first and second gate electrodes are oriented in opposite directions to each other.

6. A method of manufacturing a nonvolatile semiconductor memory, comprising:
forming an insulator structure on a semiconductor substrate, wherein said insulator structure has a trench that reaches said semiconductor substrate;
forming a first gate insulating film on said semiconductor substrate within said trench;
blanket depositing a first gate material film and etching-back said first gate material film to form a first gate electrode on said first gate insulating film within said trench;
silicidation of an upper surface of said first gate electrode;
forming a trench structure that includes said first gate insulating film and said first gate electrode and fills said trench;
removing said insulator structure;
blanket forming a second gate insulating film;
blanket depositing a second gate material film and etching-back said second gate material film to form a second gate electrode on said second gate insulating film lateral to said trench structure; and
silicidation of an upper surface of said second gate electrode,
wherein any one of said first gate insulating film and said second gate insulating film is a charge trapping film that traps charges, and at least one of said upper surface of said first and second gate electrodes is convex curved.

7. The method according to claim 6, further comprising: blanket depositing a first insulating film and etching-back said first insulating film, after the formation of said first gate electrode and before said silicidation of the upper surface of said first gate electrode.

8. The method according to claim 7, further comprising: forming a first diffusion layer in said semiconductor substrate lateral to said first gate electrode, after the formation of said first gate electrode and before said silicidation of the upper surface of said first gate electrode, wherein in said silicidation of the upper surfaces of said first gate electrode and said second gate electrode and said first diffusion layer are silicided simultaneously.

9. The method according to claim 6, further comprising: blanket depositing a second insulating film and etching-back said second insulating film to form a cover layer over the upper part region of the second gate electrode, after said silicidation of the upper surface of said second gate electrode.

10. The method according to claim 9, further comprising:
forming a second diffusion layer in said semiconductor substrate lateral to said second gate electrode, after the formation of said second gate electrode; and
silicidation of an upper surface of said second diffusion layer, after said etching-back of said second insulating film.

11. The method according to claim 6, wherein the curved upper surfaces of said first and second gate electrodes are oriented in opposite directions to each other.

* * * * *